US009082492B2

(12) United States Patent
Kwak

(10) Patent No.: US 9,082,492 B2
(45) Date of Patent: Jul. 14, 2015

(54) NONVOLATILE MEMORY DEVICE AND MEMORY MANAGEMENT METHOD THEREOF

(71) Applicant: DongHun Kwak, Hwaseong-si (KR)

(72) Inventor: DongHun Kwak, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 220 days.

(21) Appl. No.: 13/686,906

(22) Filed: Nov. 27, 2012

(65) Prior Publication Data
US 2013/0223147 A1 Aug. 29, 2013

(30) Foreign Application Priority Data

Feb. 28, 2012 (KR) ........................ 10-2012-0020506

(51) Int. Cl.
| G11C 16/10 | (2006.01) |
| G11C 16/16 | (2006.01) |
| G11C 16/34 | (2006.01) |
| H01L 27/115 | (2006.01) |
| G11C 16/04 | (2006.01) |

(52) U.S. Cl.
CPC ............ *G11C 16/107* (2013.01); *G11C 16/105* (2013.01); *G11C 16/16* (2013.01); *G11C 16/3427* (2013.01); *H01L 27/11582* (2013.01); *G11C 16/0483* (2013.01)

(58) Field of Classification Search
CPC .............................. G11C 16/107; G11C 16/16
USPC ..................................................... 365/185.11
See application file for complete search history.

(56) References Cited

U.S. PATENT DOCUMENTS

| 7,804,718 B2 * | 9/2010 | Kim .......................... 365/185.29 |
| 2005/0111259 A1 | 5/2005 | Fukuda et al. |
| 2009/0310422 A1 | 12/2009 | Edahiro et al. |
| 2010/0046267 A1 | 2/2010 | Yan et al. |
| 2010/0322000 A1 * | 12/2010 | Shim et al. ............... 365/185.03 |
| 2011/0019486 A1 | 1/2011 | Jang et al. |
| 2011/0131367 A1 | 6/2011 | Park et al. |
| 2011/0182105 A1 | 7/2011 | Yan et al. |

FOREIGN PATENT DOCUMENTS

| JP | 2007-149170 | 6/2007 |
| JP | 2009-301616 | 12/2009 |
| JP | 2011-028833 | 2/2011 |

(Continued)

*Primary Examiner* — Hoai V Ho
*Assistant Examiner* — Tri Hoang
(74) *Attorney, Agent, or Firm* — Renaissance IP Law Group LLP

(57) ABSTRACT

Embodiments include a memory managing method of a nonvolatile memory device, which includes detecting whether sub-blocks of memory blocks are programmed, and programming write data at a memory block having a programmed sub-block from among the memory blocks, prior to programming a memory block having no programmed sub-blocks from among the memory blocks, according to the detection result. Embodiments also include programming the write data at a sub-block, closest to a common source line, from among unprogrammed sub-blocks of the memory block. Embodiments also include erasing at least one sub-block that is farthest from the common source line, prior to erasing other sub-blocks from among the programmed sub-blocks in the memory block. Embodiments also include selectively programming or erasing sub-blocks according to read merge times.

13 Claims, 20 Drawing Sheets

(56) References Cited

FOREIGN PATENT DOCUMENTS

| KR | 20050036772 A | 4/2005 |
| KR | 1020110009503 A | 1/2011 |
| KR | 20110069030 A | 6/2011 |
| KR | 1020110059313 A | 6/2011 |

* cited by examiner

US 9,082,492 B2

NONVOLATILE MEMORY DEVICE AND MEMORY MANAGEMENT METHOD THEREOF

CROSS-REFERENCE TO RELATED APPLICATIONS

A claim for priority under 35 U.S.C. §119 is made to Korean Patent Application No. 10-2012-0020506 filed Feb. 28, 2012, in the Korean Intellectual Property Office, the entire contents of which are hereby incorporated by reference.

BACKGROUND

The inventive concepts described herein relate to a nonvolatile memory device and a memory management method thereof, and more particularly, relate to a three-dimensional nonvolatile memory device and a memory management method thereof.

A semiconductor memory device is a memory device, which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

More recently, a semiconductor memory device with a three-dimensional array structure has been developed to improve the integrity of the semiconductor memory device.

SUMMARY

Example embodiments of the inventive concept provide a memory managing method of a nonvolatile memory device, which comprises detecting whether sub-blocks of memory blocks are programmed, and programming write data at a memory block having a programmed sub-block from among the memory blocks, prior to programming a memory block having no programmed sub-blocks from among the memory blocks, according to the detection result.

In example embodiments, the sub-blocks are programmable independently.

In example embodiments, the nonvolatile memory device includes a substrate and a plurality of memory cells stacked along a direction intersecting with the substrate.

Example embodiments of the inventive concept also provide a memory managing method of a nonvolatile memory device, which comprises detecting whether sub-blocks of a memory block are programmed, and programming write data at the memory block according to the detection result. The write data may be programmed at a sub-block, closest to a common source line, from among unprogrammed sub-blocks of the memory block.

In example embodiments, the memory managing method further comprises erasing at least one sub-block in the memory block according to the detection result.

In example embodiments, the at least one sub-block is farthest from the common source line, from among programmed sub-blocks in the memory block.

In example embodiments, the sub-blocks share the common source line.

In example embodiments, the memory managing method further comprises reading merge times of the sub-blocks in the memory block, determining a priority block to be a sub-block having an erase priority, and selectively erasing the priority block from among the sub-blocks according to the read merge times.

In example embodiments, the priority block is determined according to relative distances between the common source line and the sub-blocks.

In example embodiments, selectively erasing further comprises determining a merge time block to be a sub-block having a merge time shorter than that of the priority block of the memory block, and comparing a merge time difference between the priority block and the merge time block with a predetermined value.

In example embodiments, the merge times are read out from a merge time table included in a flash translation layer.

Example embodiments of the inventive concept also provide a memory managing method of a nonvolatile memory device, which comprises reading program and/or erase (hereinafter P/E) cycles of sub-blocks of memory blocks, determining a priority block to be a sub-block having a program priority, and selectively programming the priority block from among the sub-blocks according to the read P/E cycles. The priority block may be determined according to relative distances between a common source line and the sub-blocks and according to whether sub-blocks in each of the memory blocks are programmed.

In example embodiments, selectively programming a sub-block comprises determining a P/E cycle block to be a sub-block having a P/E cycle smaller than that of the priority block, and comparing a P/E cycle difference between the priority block and the P/E cycle block with a predetermined value.

In example embodiments, selectively programming a sub-block further comprises programming the P/E cycle block.

In example embodiments, the P/E cycles are read out from a P/E cycle table included in a flash translation layer.

Example embodiments of the inventive concept also include A method for programming or erasing memory blocks, the method comprising detecting which sub-blocks of a plurality of memory blocks are programmed, detecting which sub-blocks of the plurality of memory blocks are unprogrammed, determining that at least one of the memory blocks is a partial storage block having at least one programmed sub-block and at least one unprogrammed sub-block, determining that at least one of the memory blocks is an empty storage block have unprogrammed sub-blocks, and programming write data at the at least one unprogrammed sub-block of the partial storage block prior to programming any write data at the unprogrammed sub-blocks of the empty storage block.

In example embodiments, the method includes detecting relative distances of sub-blocks of the plurality of memory blocks to a common source line, and prioritizing the programming of the sub-blocks that are relatively closer to the common source line over the sub-blocks that are relatively farther away from the common source line.

BRIEF DESCRIPTION OF THE FIGURES

The above and other advantages and features will become apparent from the following description with reference to the following figures, wherein like reference numerals refer to like parts throughout the various figures unless otherwise specified, and wherein.

DETAILED DESCRIPTION

Figure 1:
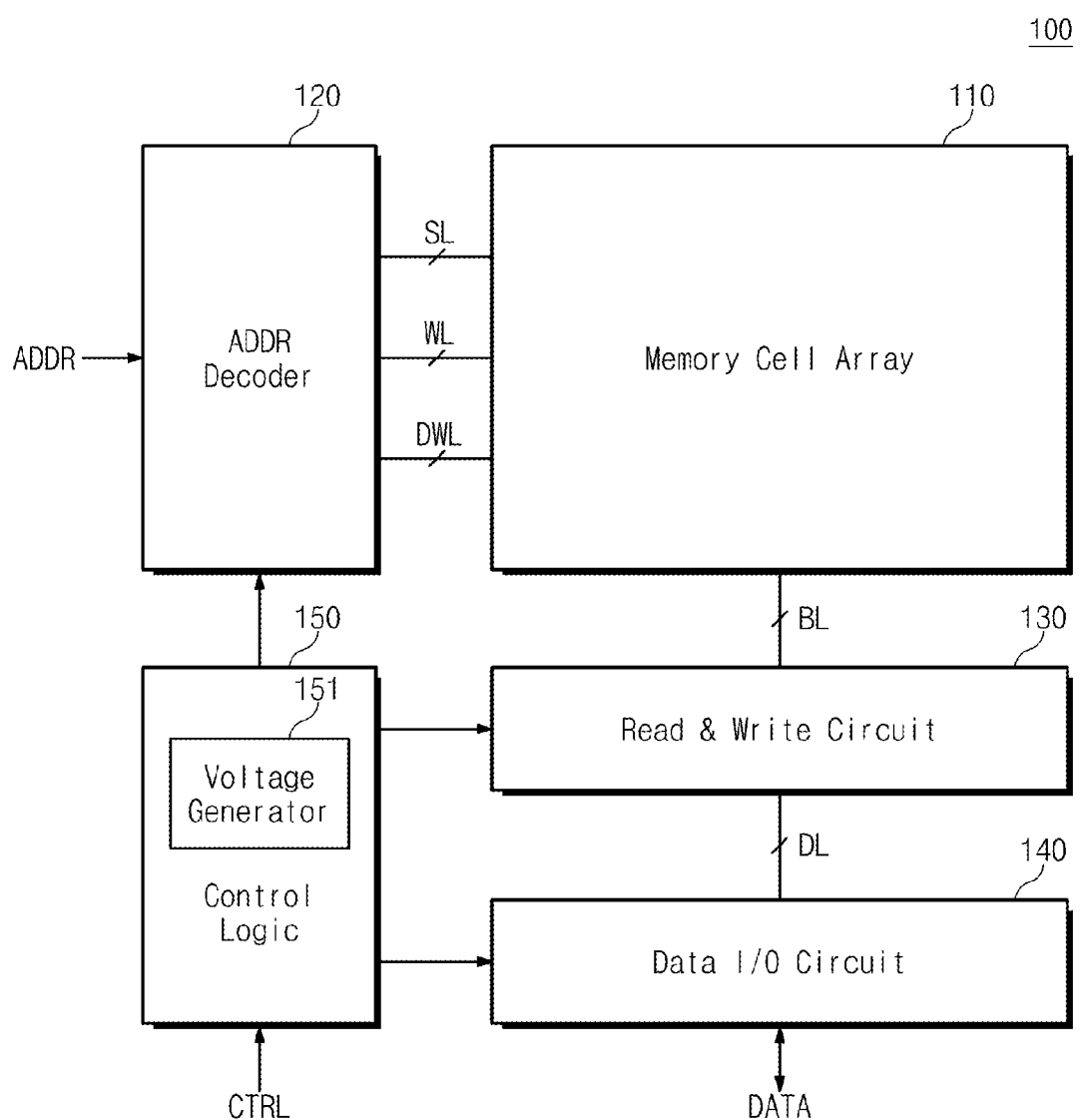
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device according to an embodiment of the inventive concept. Referring to FIG. 1, a nonvolatile memory device 100 may include a memory cell array 110, an address decoder 120, a read/write circuit 130, a data input/output circuit 140, and control logic 150.

The memory cell array 110 may be connected to the address decoder 120 via word lines WL, selection lines SL (e.g., string selection line SSL and ground selection line GSL), and dummy word lines DWL and to the read/write circuit 130 via bit lines BL. The memory cell array 110 may include a plurality of memory cells. In example embodiments, memory cells arranged in a row direction may be connected to word lines WL, and memory cells arranged in a column direction may be connected to bit lines BL. For example, memory cells arranged in a column direction may form a plurality of cell groups (e.g., strings) that are connected to the bit lines, respectively. In example embodiments, the memory cell array 110 may include multiple memory cells each storing one or more bits of data.

The address decoder 120 may be connected to the memory cell array 110 via the word lines WL, the selection lines SL (e.g., string selection line SSL and ground selection line GSL), and the dummy word lines DWL. The address decoder 120 may operate responsive to the control of the control logic 150. The address decoder 120 may receive an address ADDR from an external device.

The address decoder 120 may decode a row address of the input address ADDR, and may select the word lines WL, the selection lines SL (e.g., string selection line SSL and ground selection line GSL), and the dummy word lines DWL in response to the decoded row address. The address decoder 120 may be configured to decode a column address of the input address ADDR. The address decoder 120 may provide the decoded column address to the read/write circuit 130. In an exemplary embodiment, the address decoder 120 may include a row decoder decoding a row address, a column decoder decoding a column address, an address buffer, and the like.

The read/write circuit 130 may be coupled with the memory cell array 110 via bit lines BL. The read/write circuit 130 may be configured to exchange data with an external device and with the data input/output circuit 140 via data lines DL. The read/write circuit 130 may operate responsive to the control of the control logic 150. The read/write circuit 130 may select bit lines BL in response to the decoded column address provided from the address decoder 120.

In example embodiments, the read/write circuit 130 may receive data from an external device to write it in the memory cell array 110. The read/write circuit 130 may read data from the memory cell array 110 to output it to the external device. The read/write circuit 130 may read data from the first storage area of the memory cell array 110 to write it in the second storage area thereof. That is, the read/write circuit 130 may perform a copy-back operation.

In example embodiments, the read/write circuit 130 may include constituent elements such as a page buffer (or, a page register), a column selecting circuit, a data buffer, and the like. In other example embodiments, the read/write circuit 130 may include constituent elements such as a sense amplifier, a write driver, a column selecting circuit, a data buffer, and the like.

The data input/output circuit 140 may be connected to the read/write circuit 130 via the data lines DL. The data input/output circuit 140 may operate responsive to the control of the control logic 150. The data input/output circuit 140 may be configured to exchange data with the external device. The data input/output circuit 140 may be configured to transfer data provided from the external device to the read/write circuit 130 via the data lines DL. The data input/output circuit 140 may be configured to provide the external device with data transferred from the read/write circuit 130 via the data lines DL. In example embodiments, the data input/output circuit 140 may include well-known element such as data buffers and the like.

The control logic 150 may be connected to the address decoder 120, the read/write circuit 130, and the data input/output circuit 140. The control logic 150 may be configured to control an overall operation of the nonvolatile memory device 100. The control logic 150 may operate responsive to a control signal CTRL from the external device.

The control logic 150 may include a voltage generator 151. The voltage generator 151 may be configured to generate various levels of voltages needed for an operation of the nonvolatile memory device 100. For example, the voltage generator 151 may be configured to generate various levels of high voltages. Voltages generated by the voltage generator 151 may be provided to the word lines WL and the dummy word lines DWL via the address decoder 120.

Figure 2:
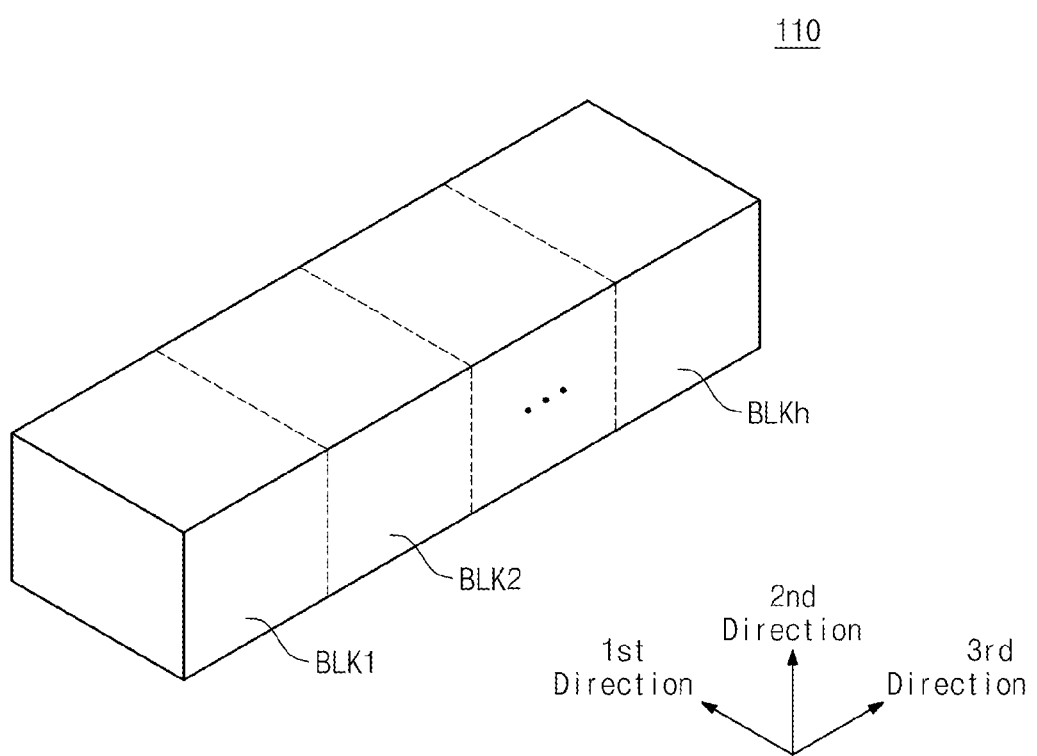
FIG. 2 is a diagram schematically illustrating a memory cell array in FIG. 1 according to an embodiment of the inventive concept.

FIG. 2 is a diagram schematically illustrating a memory cell array in FIG. 1 according to an embodiment of the inventive concept. Referring to FIG. 2, a memory cell array 110 may include a plurality of memory blocks BLK1 to BLKh, each of which is formed to have a three-dimensional structure (or, a vertical structure). For example, each of the memory blocks BLK1 to BLKh may include structures extending along first to third directions. For example, each of the memory blocks BLK1 to BLKh may include NAND strings NS extending along the second direction. For example, NAND strings NS may be provided along the first and third directions.

Although not shown in FIG. 2, each NAND string NS may be connected to a bit line, at least one string selection line, at least one ground selection line, word lines, at least one dummy word line, and/or a common source line. That is, each memory block may be connected to a plurality of bit lines, a plurality of string selection lines, a plurality of ground selection lines, a plurality of dummy word lines, and/or a plurality of common source lines. Each memory block will be more fully described with reference to FIG. 3.

Figure 3:
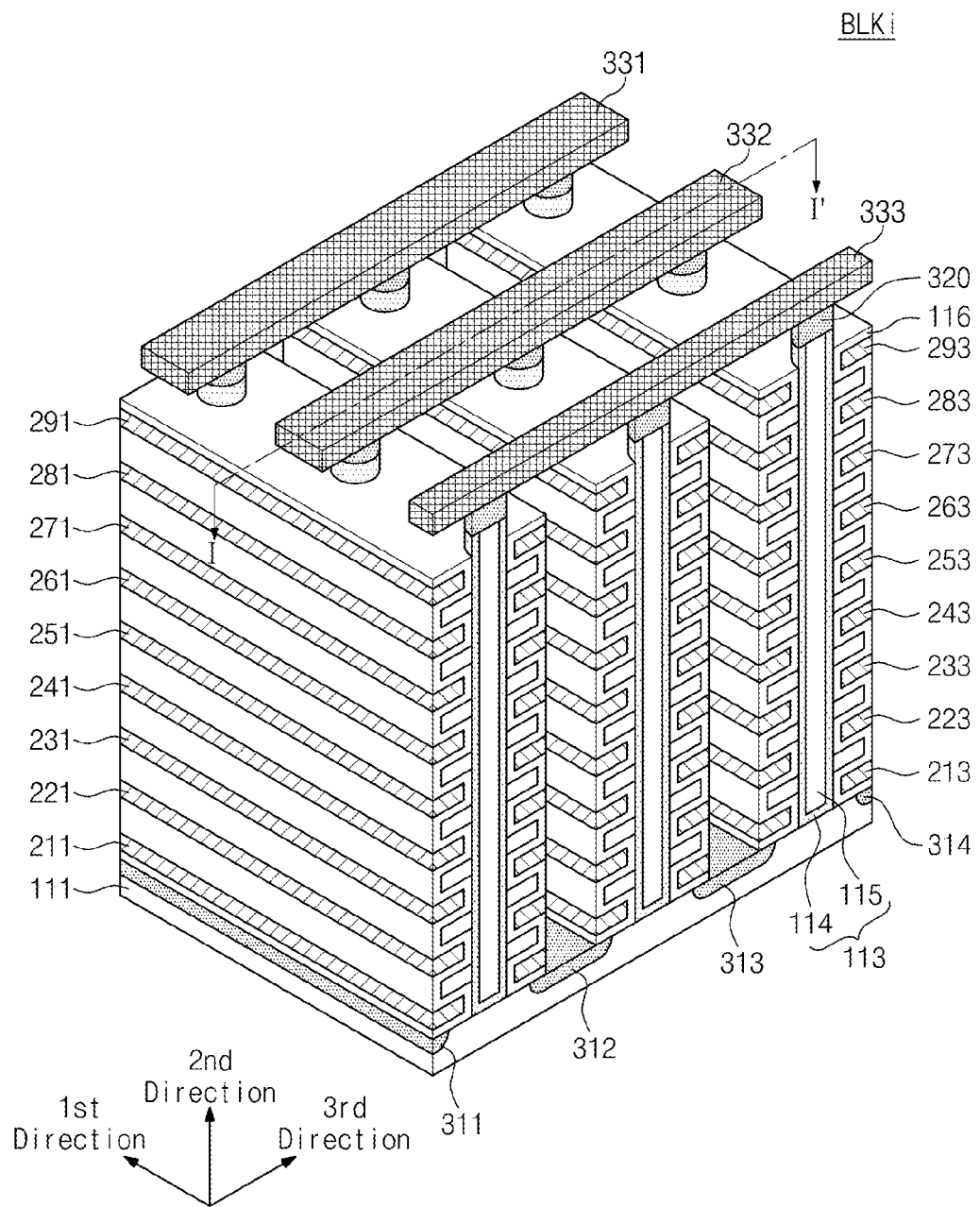
FIG. 3 is a perspective view of a part of a memory block in FIG. 2 according to an embodiment of the inventive concept.
Figure 4:
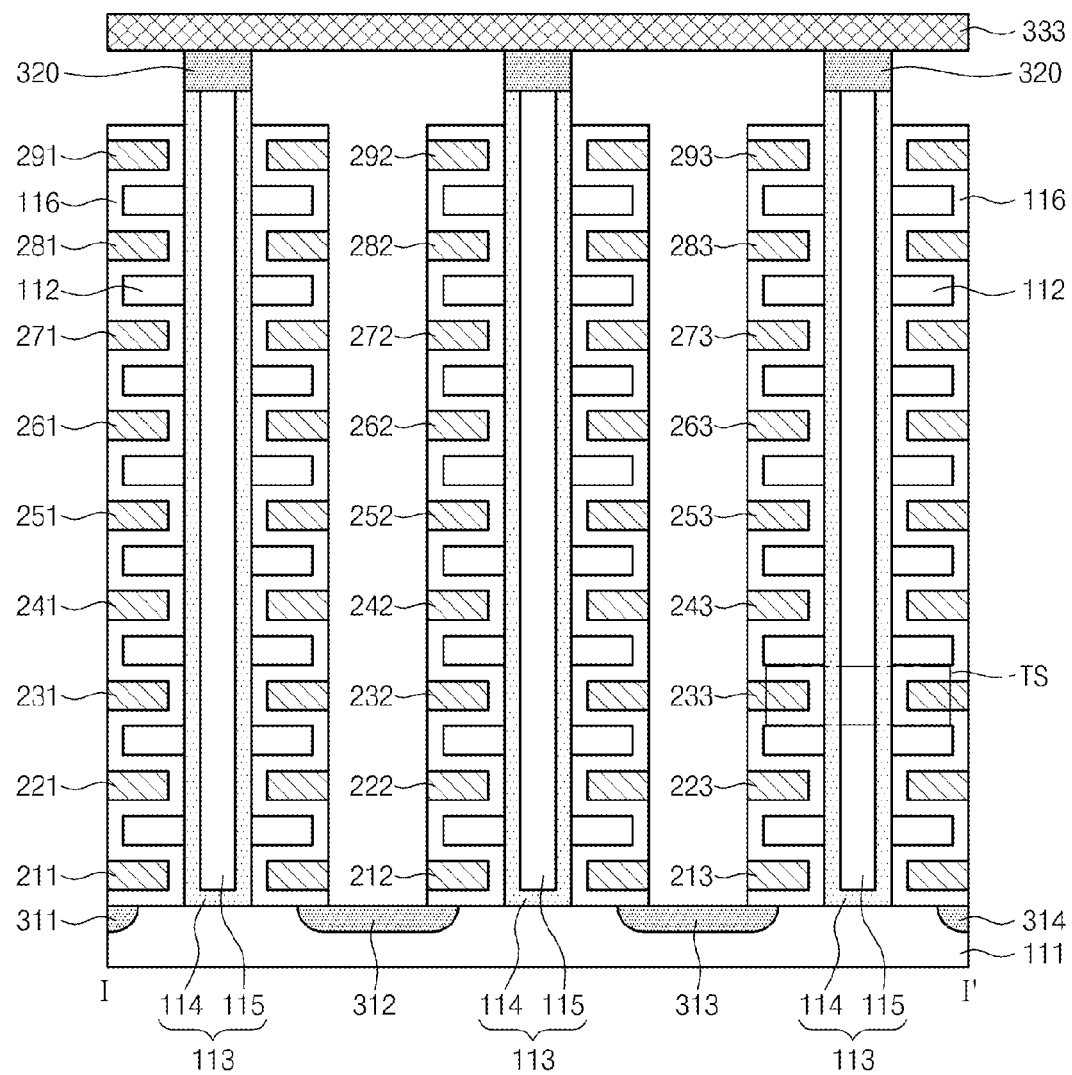
FIG. 4 is a cross-sectional view taken along a line I-I' of FIG. 3.

FIG. 3 is a perspective view of a part of a memory block in FIG. 2 according to an embodiment of the inventive concept. FIG. 4 is a cross-sectional view taken along a line I-I' of FIG. 3. Referring to FIGS. 3 and 4, a memory block BLKi may include structures that extend along first to third directions.

First, a substrate 111 may be provided. In example embodiments, the substrate 111 may include a silicon material doped with a first-type impurity. For example, the substrate 111 may be a silicon material doped with a p-type impurity or a p-well (or, a pocket p-well), and may further include an n-well surrounding the p-well. Below, it is assumed that the substrate 111 is p-type silicon. However, the substrate 111 is not limited thereto.

A plurality of doping regions 311 to 314 extending along the first direction may be provided at the substrate 111. For example, a plurality of doping regions 311 to 314 (hereinafter, referred to as first to fourth doping regions) may be an n-type. Hereinafter, it is assumed that the first to fourth doping regions 311 to 314 are an n-type. However, the first to fourth doping regions 311 to 314 are not limited thereto.

On the substrate 111 between the first and second doping regions 311 and 312, a plurality of insulating materials 112 extending along the first direction may be sequentially provided along the second direction. For example, the plurality of insulating materials 112 and the substrate 111 may be spaced apart along the second direction. For example, the plurality of insulating materials 112 may be formed to be separated by a predetermined distance along the second direction. In example embodiments, the insulating materials 112 may include an insulating material such as silicon oxide.

On the substrate 111 between the first and second doping regions 311 and 312, a plurality of pillars 113 may be provided, which are sequentially disposed along the first direction and pass through the insulating materials 112 along the second direction. In example embodiments, the pillars 113 may contact with the substrate 111 through the insulating materials 112, respectively.

In example embodiments, each of the pillars 113 may be formed of a plurality of materials. For example, a surface layer 114 of each pillar 113 may include a first-type silicon material. For example, the surface layer 114 of each pillar 113 may include a silicon material doped with the same type as the substrate 111. Hereinafter, it is assumed that the surface layer 114 of each pillar 113 includes p-type silicon. However, the surface layer 114 of each pillar 113 is not limited thereto.

An inner layer 115 of each pillar 113 may be formed of an insulating material. For example, the inner layer 115 of each pillar 113 may include an insulating material such as silicon oxide.

Between the first and second doping regions 311 and 312, an insulating film 116 may be provided along exposed surfaces of the substrate 111, the insulating materials 112, and the pillars 113. For example, the thickness of the insulating film 116 may be less than half a distance between the insulating materials 112. That is, a region where a material other than the insulating materials 112 and the insulation layer 116 is disposed may be provided between an insulating film 116 provided on a lower surface of a first insulating material among the insulating materials 112 and an insulating film 116 provided on an upper surface of a second insulating material and at the lower portion of the first insulating material.

Between the first and second doping regions 311 and 312, conductive materials 211 to 291 may be provided on an exposed surface of the insulating film 116. For example, a conductive material 211 extending along the first direction may be provided between the substrate 111 and the insulating material 112 adjacent to the substrate 111. More specifically, the conductive material 211 extending along the first direction may be provided between the substrate 111 and the insulating film 116 at a lower surface of the insulating material adjacent to the substrate 111.

A conductive material extending along the first direction may be provided between an insulating film 116 on an upper surface of a specific insulating material of the insulating materials 112 and an insulating film 116 on a lower surface of an insulating material disposed at a top of the specific insulating material. A plurality of conductive materials 221 to 281 extending along the first direction may be provided among the insulating materials 112. Further, a conductive material 291 extending along the first direction may be provided on the insulating materials 112. In example embodiments, the conductive materials 211 to 291 may be a metal material. For example, the conductive materials 211 to 291 may be a conductive material such as polysilicon.

The same structure as that on the first and second doping regions 311 and 312 may be provided between the second and third doping regions 312 and 313. Between the second and third doping regions 312 and 313, there may be provided the insulating materials 112 extending along the first direction, the pillars 113 sequentially disposed in the first direction and passing through the insulating materials 112 along the second direction, the insulating film 116 provided on exposed surfaces of the pillars 113 and the insulating materials 112, and the conductive materials 212 to 292 extending along the first direction.

The same structure as that on the first and second doping regions 311 and 312 may be provided between the third and fourth doping regions 313 and 314. Between the third and fourth doping regions 313 and 314, there may be provided the insulating materials 112 extending along the first direction, the pillars 113 sequentially disposed in the first direction and passing through the insulating materials 112 in the third direction, the insulation layer 116 provided on the exposed surfaces of the insulating materials 112 and the pillars 113, and the first conductive materials 213 to 293 extending along the first direction.

Drains 320 may be provided on the pillars 113, respectively. In example embodiments, the drains 320 may include a second-type silicon material. For example, the drains 320 may be an n-type silicon material. Hereinafter, it is assumed that the drains 320 include an n-type silicon material. However, the drains 320 are not limited thereto. In example embodiments, a width of each drain 320 may be wider than that of a corresponding pillar 113. For example, each drain 320 may be provided on a corresponding pillar 113 to have a pad shape.

Conductive materials 331 to 333 extending along the third direction may be provided on the drains 320. The conductive materials 331 to 333 may be sequentially disposed along the first direction. The conductive materials 331 to 333 may be connected to the drains 320 of corresponding regions, respectively. In example embodiments, the drains 320 and the second conductive material 333 extending along the third direction may be connected through contact plugs. In example embodiments, the conductive materials 331 to 333 may be a metal material. For example, the conductive materials 331 to 333 may be a conductive material such as polysilicon.

In FIGS. 3 and 4, each pillar 113 may form a string together with an adjacent region of an insulating film 116 and an adjacent region among the conductive lines 211 to 291, 212 to 292, and 213 to 293 extending along the first direction. For example, each pillar 113 may form a NAND string NS together with an adjacent region of an insulating film 116 and an adjacent region among the conductive lines 211 to 291, 212 to 292, and 213 to 293 extending along the first direction. The NAND string NS may include a plurality of transistor structures TS. The transistor structure TS will be more fully described with reference to FIG. 5.

Figure 5:
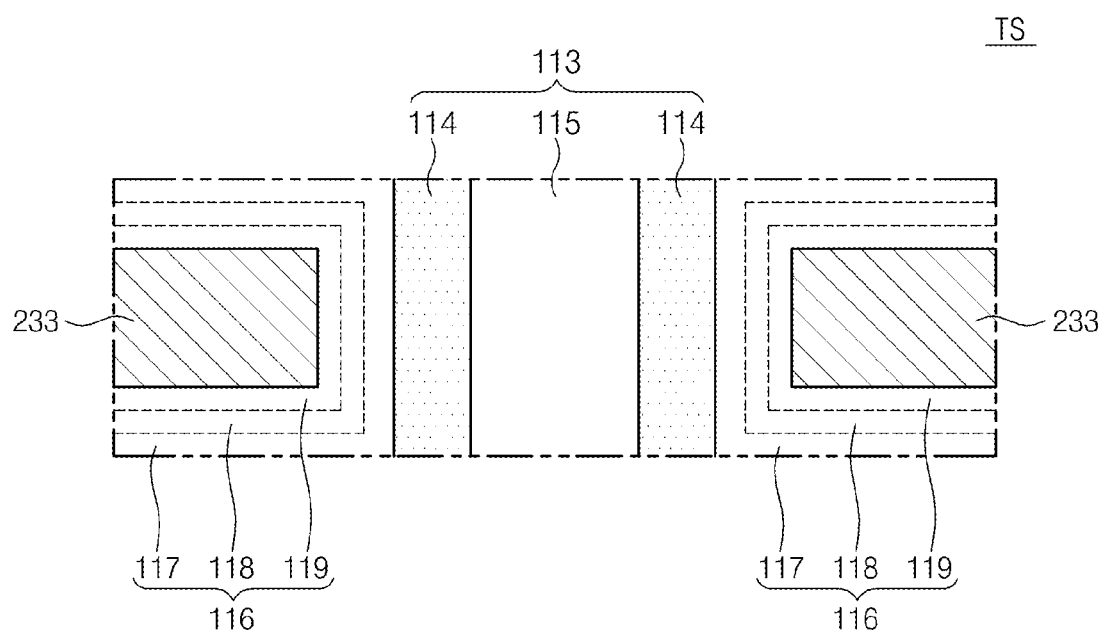
FIG. 5 is a cross-sectional view of a transistor structure TS in FIG. 4.

FIG. 5 is a cross-sectional view of a transistor structure TS in FIG. 4. Referring to FIGS. 3 to 5, an insulating film 116 may include first to third sub-insulating films 117 to 119.

In example embodiments, the first sub-insulating film 117 adjacent to the pillar 113 may include a thermal oxide layer. The second sub-insulating film 118 may include a nitride layer or a metal oxide layer (e.g., an aluminum oxide layer, a hafnium oxide layer, or the like). In example embodiments, the third sub-insulating film 119 adjacent to a conductive material 233 extending along a first direction may be a single layer or a multi-layer. The third sub-insulating film 119 may be a high dielectric layer (e.g., an aluminum oxide layer or a hafnium oxide layer) having a larger dielectric constant compared with the first and second sub-insulating films 117 and 118. In example embodiments, the first to third sub-insulating films 117 to 119 may form oxide-nitride-oxide (ONO).

A p-type silicon surface layer 114 of a pillar 113 may act as a body. The first sub-insulating film 117 may act as a tunneling insulating film. The second sub-insulating film 118 may act as a charge storage film. For example, the second sub-insulating film 118 may act as a charge trap layer. The third sub-insulating film 119 adjacent to a first conductive material 233 may act as a blocking insulating film. The conductive material 233 may serve as a gate (or a control gate). That is, the conductive material 233 serving as a gate (or a control gate), the third sub-insulating film 119 serving as the blocking insulating film, the second sub-insulating film 118 serving as the charge storage layer, the first sub-insulating film 117 serving as the tunneling insulation layer, and the p-type surface layer 114 serving as a body may form a transistor (or, a memory cell transistor structure). Below, it is assumed that the p-type surface layer 114 of the pillar 113 serves as a second-direction body.

A memory block BLKi may include a plurality of pillars 113. That is, the memory block BLKi may include a plurality of NAND strings NS. In detail, the memory block BLKi may include a plurality of NAND strings NS extending along a second direction (or, a direction vertical to a substrate).

Each NAND string NS may include a plurality of transistor structures TS that are disposed along a second direction. At least one of the transistor structures TS of each NAND string NS may serve as a string selection transistor SST. At least one of the transistor structures TS of each NAND string NS may serve as a ground selection transistor GST.

Gates (or control gates) may correspond to conductive materials 211 to 291, 212 to 292, and 213 to 293 extending along a first direction. That is, the gates (or the control gates) may be extended in the first direction to form two selection lines (e.g., at least one string selection line SSL and at least one ground selection line GSL) and word lines extending along the first direction.

Conductive materials 331 to 333 extending in a third direction may be connected to first ends of the NAND strings NS, respectively. Conductive materials 331 to 333 may act as bit lines BL. In the memory block BLK1, one bit line may be connected with a plurality of NAND strings.

Second-type doping regions 311 to 314 extending in the first direction may be provided to other ends of the NAND strings NS, respectively. The second-type doping regions 311 to 314 may serve as common source lines CSL.

To sum up the above description, the memory block BLKi may include a plurality of NAND strings that extend in a direction (i.e., the second direction) vertical to the substrate 111, and may be a NAND flash memory block (e.g., a charge trap type) in which a plurality of NAND strings NS may be connected to one bit line BL.

FIGS. 3 to 5 were described under the assumption that conductive lines 211 to 291, 212 to 292, and 213 to 293 extending along the first direction are formed at nine layers. However, the inventive concept is not limited thereto. For example, conductive lines extending along the first direction may be formed at 8, 16, or any suitable number of layers. That is, one NAND string may include 8, 16, or any suitable number of layers.

FIGS. 3 to 5 were described under the assumption that three NAND strings NS are connected to a bit line. However, the inventive concept is not limited thereto. In example embodiments, in a memory block BLKi, m NAND strings NS may be connected to a bit line BL, where m is a positive integer. The number of conductive materials 211 to 291, 212 to 292, and 213 to 293 extending along the first direction and the number of common source lines 311 to 314 may be adjusted according to the number of NAND strings NS connected to a bit line BL.

FIGS. 3 to 5 were described under the assumption that three NAND strings NS are connected to a conductive material extending along the first direction. However, the inventive concept is not limited thereto. For example, n NAND strings NS may be connected to a conductive material extending along the first direction, where n is a positive integer. The number of bit lines 331 to 333 may be adjusted according to the number of NAND strings connected to a bit line extending along the first direction.

Figure 6:
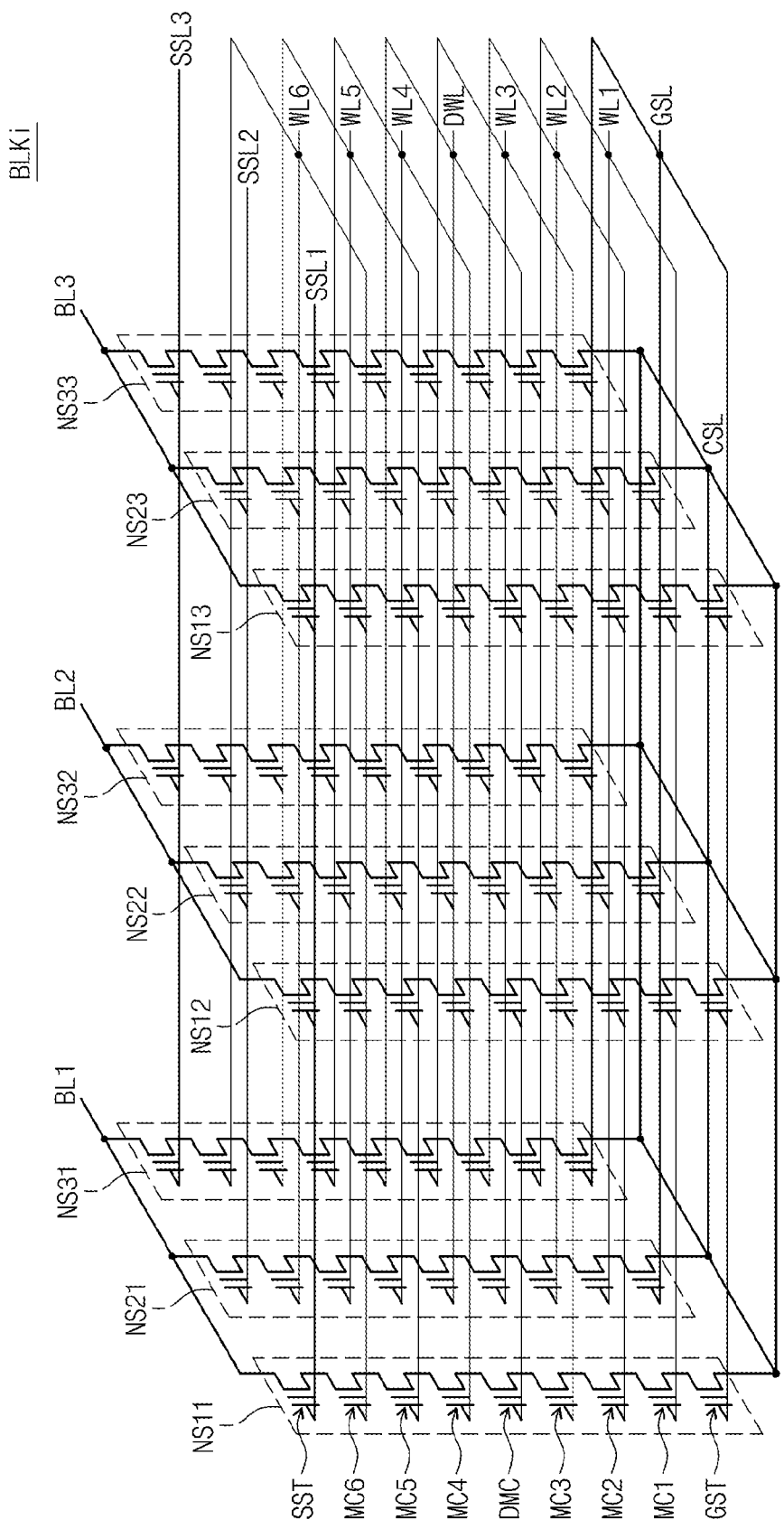
FIG. 6 is an equivalent circuit diagram of a memory block described with reference to FIGS. 3 to 5.

FIG. 6 is an equivalent circuit diagram of a memory block described with reference to FIGS. 3 to 5. Referring to FIGS. 3 to 6, NAND strings NS11, NS21, and NS31 may be provided between a first bit line BL1 and a common source line CSL. NAND strings NS12, NS22, and NS32 may be provided between a second bit line BL2 and the common source line CSL. NAND strings NS13, NS23, and NS33 may be provided between a third bit line BL3 and the common source line CSL. The third bit line BL3 may correspond to a conductive material 333 extending in the third direction.

A string selection transistor SST of each NAND string NS may be connected to a corresponding bit line BL. A ground selection transistor GST of each NAND string NS may be connected to the common source line CSL. In each NAND string NS, memory cells MC may be provided between the string selection transistor SST and the ground selection transistor GST.

Below, NAND strings NS may be defined by the row and by the column. The NAND strings NS connected in common to one bit line may form one column. For example, the NAND strings NS11 to NS31 connected to the first bit line BL1 may correspond to a first column. The NAND strings NS12 to NS32 connected to the second bit line BL2 may correspond to a second column. The NAND strings NS13 to NS33 connected to the third bit line BL3 may correspond to a third column.

The NAND strings NS connected to one string selection line SSL may form one row. For example, the NAND strings NS11 to NS13 connected to a first string selection line SSL1 may form a first row. The NAND strings NS21 to NS23 connected to a second string selection line SSL2 may form a second row. The NAND strings NS31 to NS33 connected to a third string selection line SSL3 may form a third row.

In each NAND string NS, a height may be defined. In example embodiments, in each NAND string NS, a memory cell MC1 adjacent to the ground selection transistor GST may be defined to have a height of 1 relative to the substrate, a memory cell MC2 may be defined to have a height of 2 relative to the height of the memory cell MC1 and the substrate, a memory cell MC3 may be defined to have a height of 3 relative to the height of the memory cell MC1 and the substrate, and so forth. In each NAND string NS, a height of a memory cell may increase in inverse proportion to a distance from a string selection transistor SST. As such, in each NAND string NS, a memory cell MC6 adjacent to the string selection transistor SST may be defined to have a height of 7 relative to the height of the memory cell MC1 and the substrate, a memory cell MC5 may be defined to have a height of 6 relative to the height of the memory cell MC1 and the substrate, a memory cell MC4 may be defined to have a height of 5 relative to the height of the memory cell MC1 and the substrate, and so forth.

NAND strings in the same row may share the string selection line SSL. NAND strings in different rows may be connected to different string selection lines SSL1, SSL2, and SSL3, respectively.

In each NAND string in the same row, memory cells having the same height may share a word line WL. At the same height, word lines WL connected to memory cells of NAND strings in different rows may be connected in common. For example, a word line WL1 may be connected to the memory cell MC1 and other memory cells having the same height, a word line WL2 may be connected to the memory cell MC2 and other memory cells having the same height, a word line WL3 may be connected to the memory cell MC3 and other memory cells having the same height, and so forth, through a word line WL6. In each NAND string in the same row, dummy memory cells having the same height may share a dummy word line DWL. For example, the dummy word line DWL may be connected to a dummy memory cell DMC and other dummy memory cells having the same height. At the same height, dummy word lines WL connected to memory cells of NAND strings in different rows may be connected in common.

In example embodiments, the word lines WL or the dummy word lines DWL may be connected in common at a layer where conductive materials 211 to 291, 212 to 292, and 213 to 293 extending along a first direction are provided. In example embodiments, the conductive materials 211 to 291, 212 to 292, and 213 to 293 extending along the first direction may be connected to an upper layer via contacts. The conductive materials 211 to 291, 212 to 292, and 213 to 293 extending along the first direction may be connected in common at the upper layer.

In the same row of NAND strings NS, ground selection transistors GST may share a ground selection line GSL. In different rows of NAND strings NS, ground selection transistors GST may share the ground selection line GSL. That is, the NAND strings NS11 to NS13, NS21 to NS23, and NS31 to NS33 may be connected in common to the ground selection line GSL.

The common source line CSL may be connected in common to NAND strings NS. For example, first to fourth doping regions 311 to 314 may be interconnected at an active region of a substrate 111. For example, the first to fourth doping regions 311 to 314 may be connected to an upper layer via contacts. The first to fourth doping regions 311 to 314 may be connected in common at the upper layer.

As illustrated in FIG. 6, word lines placed at the same height may be connected in common Thus, when a word line placed at a specific height is selected, all NAND strings connected with the selected word line may be selected. NAND strings in different rows may be connected to different string selection lines. Thus, NAND strings in an unselected row from among NAND strings connected with the same word line may be separated from a corresponding bit line by selecting the string selection lines SSL1 to SSL3. That is, a row of NAND strings may be selected by selecting and unselecting the string selection lines SSL1 to SSL3. A column of NAND strings in a selected row may be selected by selecting bit lines BL1 to BL3.

Each NAND string NS may include a dummy memory cell DMC. First to third memory cells MC1 to MC3 may be provided between the dummy memory cell DMC and a ground selection transistor GST. Fourth to sixth memory cells MC4 to MC6 may be provided between the dummy memory cell DMC and a string selection transistor SST. Below, it is assumed that memory cells MC of each NAND string NS are divided into memory cell groups by the dummy memory cell DMC. Memory cells (e.g., MC1 to MC3) adjacent to the ground selection transistor GST may form a lower memory cell group. Memory cells (e.g., MC4 to MC6) adjacent to the string selection transistor SST may form an upper memory cell group.

Figure 7:
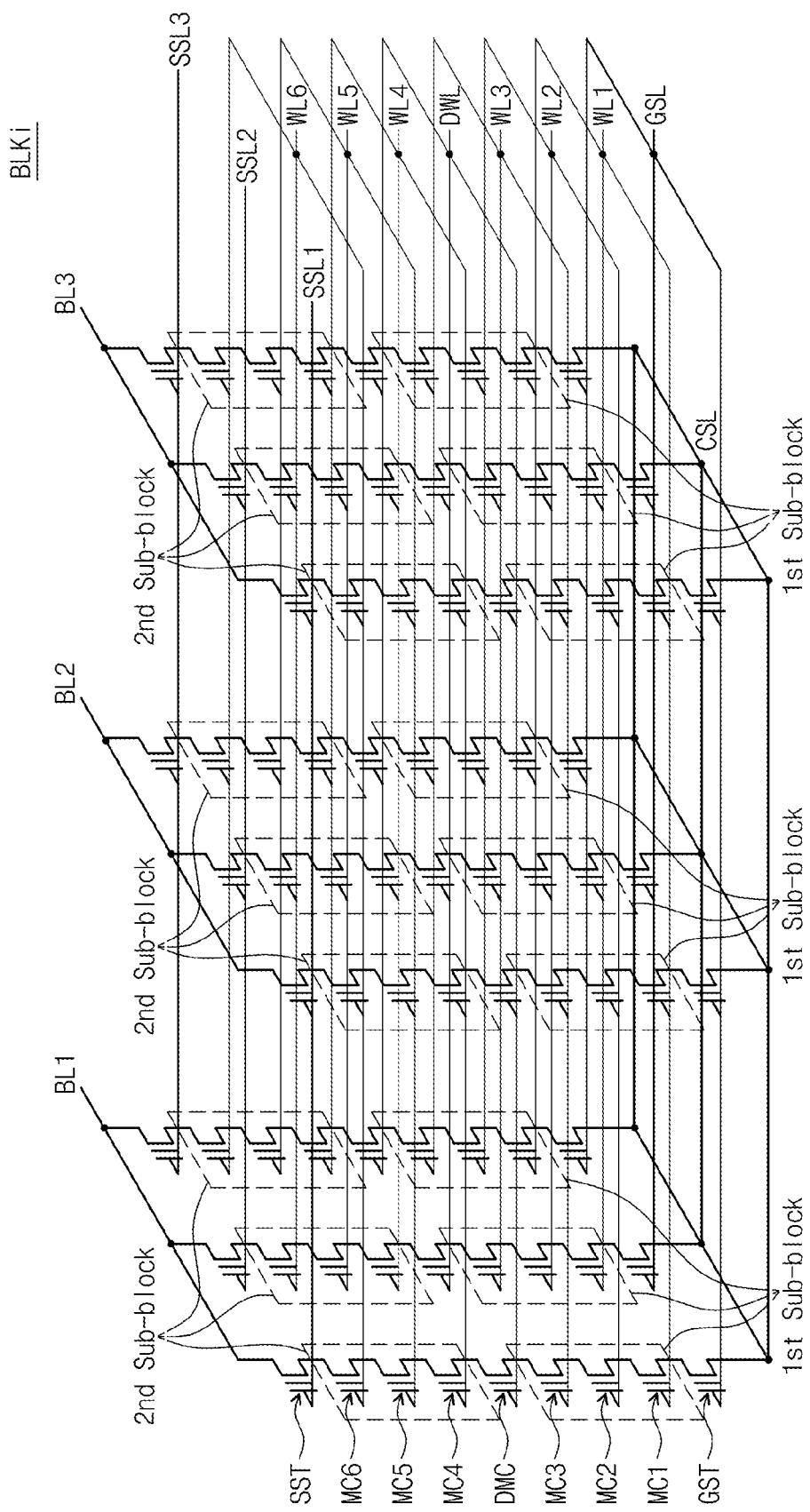
FIG. 7 is a circuit diagram illustrating a lower memory cell group and an upper memory cell group of a memory block in FIG. 6.

FIG. 7 is a circuit diagram illustrating a lower memory cell group and an upper memory cell group of a memory block in FIG. 6. Referring to FIG. 7, a lower memory cell group and an upper memory cell group of a memory block BLKi may form a sub-block, respectively. For example, lower memory cell groups of NAND strings NS11 to NS13, NS21 to NS23, and NS31 to NS33 may constitute a first sub-block, and upper memory cell groups of NAND strings NS11 to NS13, NS21 to NS23, and NS31 to NS33 may constitute a second sub-block.

In example embodiments, a program or erase operation may be performed by the sub-block. For example, the first and second sub-blocks may be programmed or erased independently. For example, during programming of the first sub-block, the second sub-block may be program-inhibited. In addition, during erasing of the first sub-block, the second sub-block may be erase-inhibited. Likewise, during programming of the second sub-block, the first sub-block may be program-inhibited. In addition, during erasing of the second sub-block, the first sub-block may be erase-inhibited. For example, in each NAND string, when some (e.g., MC1 to MC3) of memory cells MC1 to MC6 are erased, the rest (e.g., MC4 to MC6) may be erase-inhibited. By way of another example, in each NAND string, when some (e.g., MC1 to MC3) of memory cells MC1 to MC6 are programmed, the rest (e.g., MC4 to MC6) may be program-inhibited.

Figure 8:
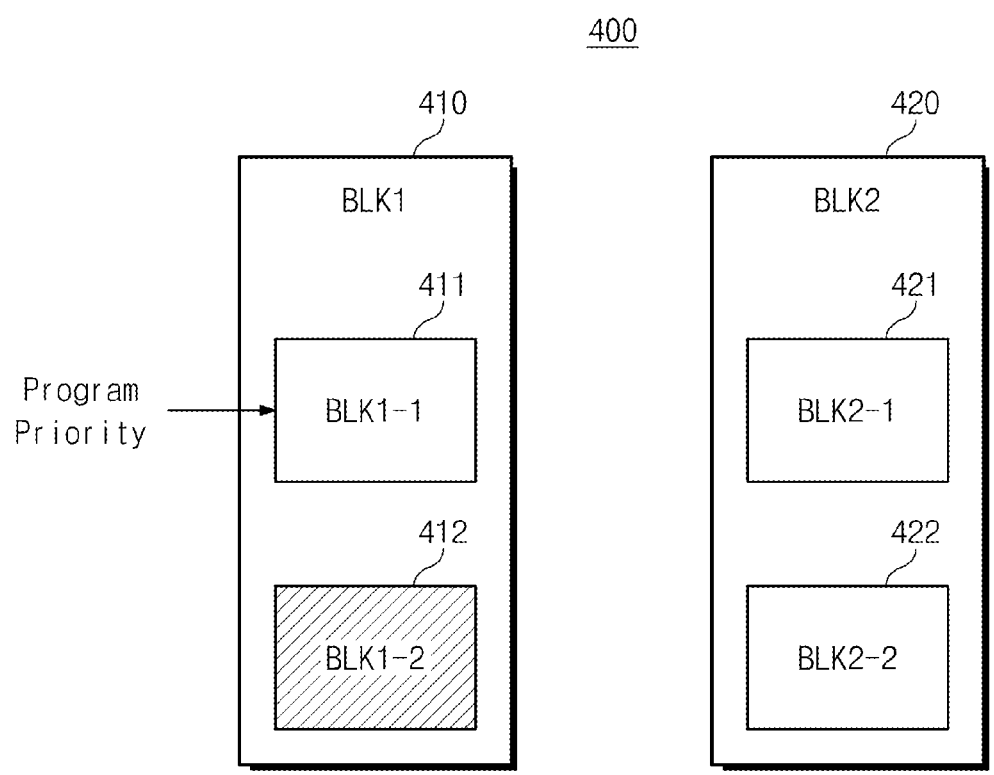
FIG. 8 is a block diagram illustrating a memory managing method according to an embodiment of the inventive concept.

FIG. 8 is a block diagram 400 illustrating a memory managing method according to an embodiment of the inventive concept. Referring to FIG. 8, the nonvolatile memory device 100 (of FIG. 1) may include a plurality of memory blocks 410 and 420. In FIG. 8, there are illustrated two memory blocks. However, the inventive concept is not limited thereto. For example, the nonvolatile memory device 100 may be configured to include three or more memory blocks.

In a case where one memory block includes a plurality of sub-blocks, read disturbance may be generated at some sub-blocks. For example, it is assumed that one memory block includes a programmed sub-block and an unprogrammed sub-block. To read the programmed sub-block, the nonvolatile memory device 100 may apply a read voltage to a word line in the unprogrammed sub-block. A threshold voltage distribution of the unprogrammed sub-block may be varied by the read voltage. This read disturbance may lower the reliability of the nonvolatile memory device 100.

The read disturbance may arise since one memory block includes both a programmed sub-block and an unprogrammed sub-block. The read disturbance may increase in proportion to an increase in the number of memory blocks, each including a programmed sub-block and an unprogrammed sub-block. Hereinafter, a memory block including both a programmed sub-block and an unprogrammed sub-block may be referred to as a partial storage block.

The inventive concept may provide a memory managing method of minimizing the read disturbance. In particular, the memory managing method of the inventive concept may minimize the number of partial storage blocks.

Below, a memory managing method according to an embodiment of the inventive concept will be described with reference to FIG. 8. Referring to FIG. 8, the two memory blocks 410 and 420 may each include two sub-blocks. A shaded sub-block 412 may indicate a programmed sub-block, and the remaining sub-blocks 411, 421, and 422 may be unprogrammed sub-blocks.

A first memory block 410 may include the programmed sub-block 412 and the unprogrammed sub-block 411. Thus, the first memory block 410 may be a partial storage block. A second memory block 420 may not include a programmed sub-block. Hereinafter, a memory block such as the second memory block 420 may be referred to as an empty memory block.

Upon a write request, control logic 150 (of FIG. 1) of the nonvolatile memory device 100 may determine a memory block in which write data is to be programmed. In this case, the control logic 150 may determine whether sub-blocks in the memory blocks 410 and 420 are programmed. Whether or not sub-blocks in the memory blocks 410 and 420 are programmed indicate that a sub-block is at a program state or an erase state, respectively.

The control logic 150 may program the write data at a memory block according to a result of the determination. To minimize the number of partial storage blocks, the control logic 150 may program the write data at the first memory block 410 having the previously programmed sub-block 412. More specifically, the write data may be programmed at an empty sub-block 411 in the first memory block 410 rather than either of the sub-blocks of the second memory block 420. The control logic 150 can program the sub-blocks 411, 412, 421, and 422, independently.

With the above description, although write data is programmed, the nonvolatile memory device 100 may initially include only one partial storage block 410, the empty sub-block 411 of which is written to prior to writing to either of the sub-blocks 421 and 422 of the second memory block 420. Otherwise, if data were to be programmed at a sub-block in the second memory block 420 before filling the partial storage block 410, the nonvolatile memory device 100 could include two partial storage blocks, which would increase the probability of read disturbance.

Thus, the read disturbance of the nonvolatile memory device 100 is reduced by minimizing the number of partial storage blocks.

Figure 9:
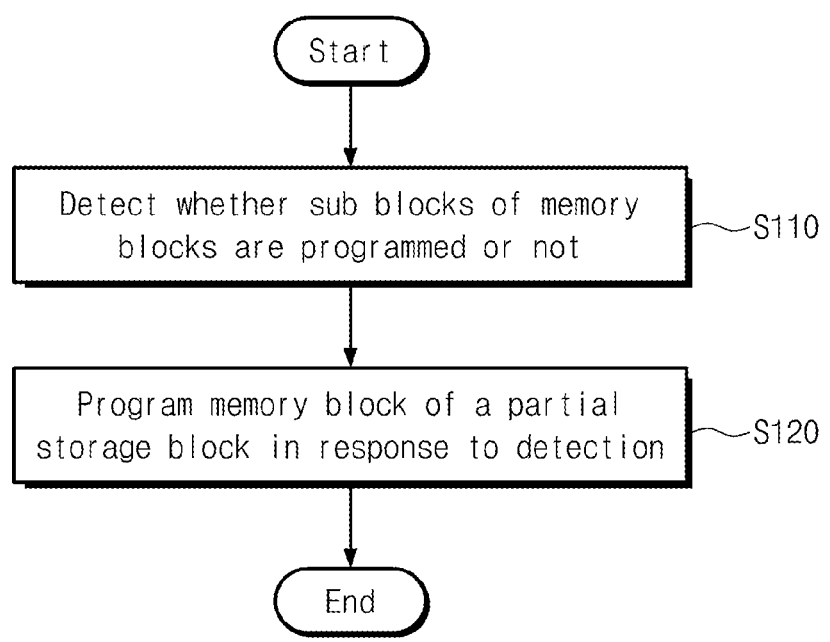
FIG. 9 is a flowchart illustrating a memory managing method according to an embodiment of the inventive concept.

FIG. 9 is a flowchart illustrating a memory managing method according to an embodiment of the inventive concept.

In operation S110, a nonvolatile memory device 100 may detect whether sub-blocks in memory blocks are programmed. As described above, whether sub-blocks in memory blocks are programmed may indicate that a sub-block is at a program state or an erase state.

In operation S120, the nonvolatile memory device 100 may program write data according to a data write request. The nonvolatile memory device 100 may program write data at a memory block including a programmed sub-block according to a detection result. That is, to minimize the number of partial storage blocks, the nonvolatile memory device 100 may program write data at a memory block including a programmed sub-block prior to a memory block not including a programmed sub-block. Put differently, the nonvolatile memory device 100 may program write data at a sub-block of a partial storage block prior to programming write data to a memory block that does not have any programmed sub-blocks.

A memory block (hereinafter, a target memory block) at which write data is to be programmed may be determined in the above-described manner. A target memory block may include an unprogrammed sub-block to store write data. That is, the target memory block may be a partial storage block. The nonvolatile memory device 100 may program write data at an unprogrammed sub-block in the target memory block. If no partial storage block exists, the nonvolatile memory device 100 may program write data at a memory block not including a programmed sub-block. Thus, the read disturbance of the nonvolatile memory device 100 is reduced by minimizing the number of partial storage blocks.

Figure 10:
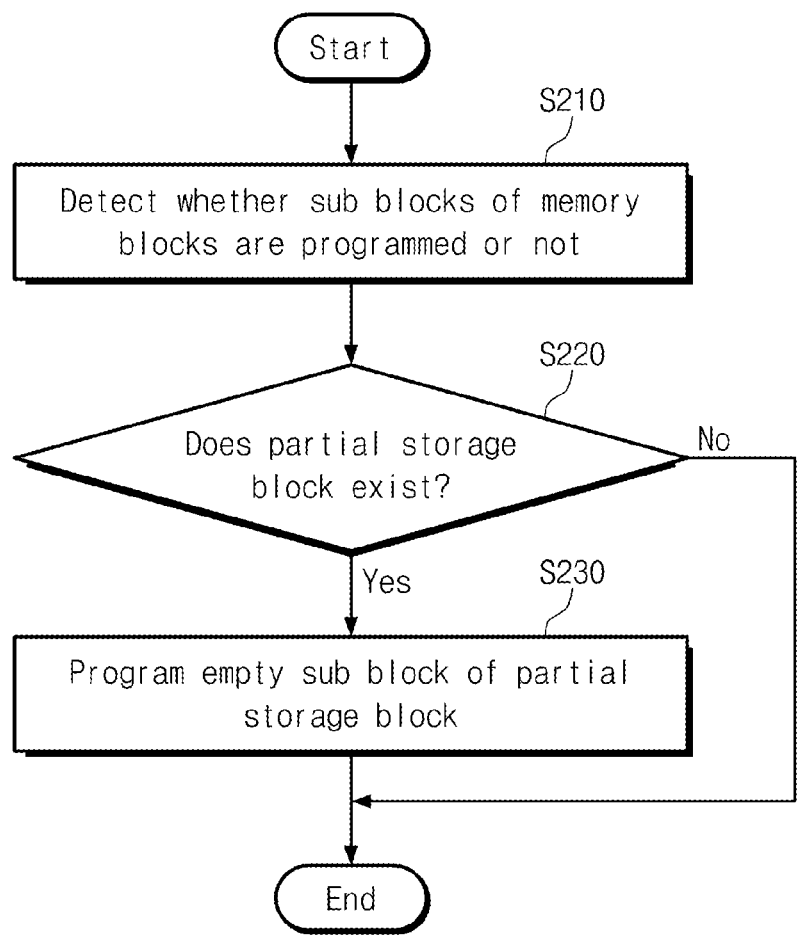
FIG. 10 is a detailed flowchart illustrating a memory managing method in FIG. 9.

FIG. 10 is a detailed flowchart illustrating a memory managing method in FIG. 9. In operation S210, the nonvolatile memory device 100 (of FIG. 1) may detect whether sub-blocks in memory blocks are programmed. As described above, whether or not sub-blocks in memory blocks are programmed may indicate that a sub-block is at a program state or an erase state.

In operation S220, the nonvolatile memory device 100 may determine whether a partial storage block exists. If so, meaning a partial storage block exists, the method proceeds to operation S230. If not, the method may be ended.

In operation S230, the nonvolatile memory device 100 may program write data according to a data write request. In particular, the nonvolatile memory device 100 may program write data at a memory block having a programmed sub-block, according to the determination result. In other words, to minimize the number of partial storage blocks, the nonvolatile memory device 100 may program write data at a memory block including a programmed sub-block prior to a memory block not including a programmed sub-block. Write data may be programmed in the same manner as described above.

Thus, the read disturbance of the nonvolatile memory device 100 may be reduced by minimizing the number of partial storage blocks.

Figure 11:
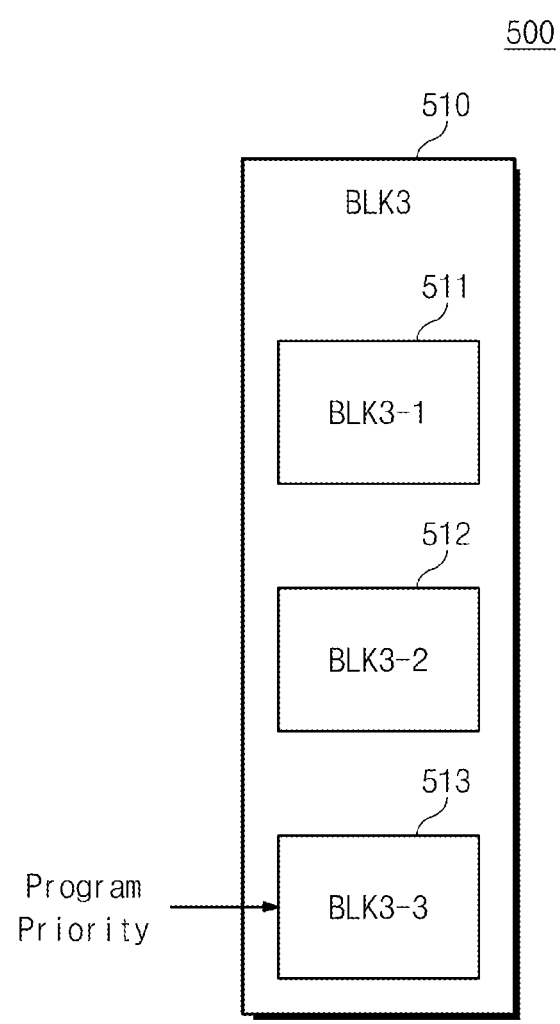
FIG. 11 is a block diagram schematically illustrating a memory managing method according to another embodiment of the inventive concept.

FIG. 11 is a block diagram schematically illustrating a memory managing method according to another embodiment of the inventive concept. Referring to FIG. 11, a memory cell array 500 in a nonvolatile memory device 100 (of FIG. 1) may include a memory block 510, which is formed of a plurality of sub-blocks 511, 512, and 513.

In the event that one memory block includes a plurality of sub-blocks, the program boosting efficiency may be reduced. It is assumed that a sub-block (hereinafter, referred to as an upper sub-block), spaced apart from a common source line CSL, from among a plurality of sub-blocks, is programmed first. With this assumption, when a sub-block (hereinafter, referred to as a lower sub-block) close to or adjacent to the common source line CSL is programmed, the programmed upper sub-block may hinder charges from being injected into the lower sub-block from a bit line. In this case, a program pulse voltage may be applied to the lower sub-block under the condition that charges are insufficiently injected into the lower sub-block from the bit line. This may mean that the boosting efficiency is lowered while programming the lower sub-block. The boosting efficiency may be reduced because a sub-block farthest away or otherwise spaced apart from the common source line CSL is programmed prior to a sub-block close to the common source line CSL.

To improve the boosting efficiency, a program operation can be performed from a sub-block close to the common source line CSL, which will be more fully described below.

Referring to FIG. 11, the memory block 510 may include three sub-blocks 511, 512, and 513. However, the inventive concept is not limited thereto. For example, the memory block 510 can be configured to include two or more sub-blocks.

The sub-blocks 511, 512, and 513 may share the common source line CSL. A lower sub-block may be closer to the common source line CSL compared with an upper sub-block. That is, an upper sub-block may be farthest away from or otherwise spaced apart from the common source line CSL compared with a lower sub-block. The sub-block 513 may be closest to the common source line CSL. A distance between the sub-block 511 and the common source line CSL may be longer than that between the sub-block 512 and the common source line CSL. A distance between the sub-block 512 and the common source line CSL may be longer than that between the sub-block 513 and the common source line CSL.

In response to a data write request, the nonvolatile memory device 100 may program write data at the sub-block 513 closest to the common source line CSL by priority. In the event that the sub-block 513 is programmed, the nonvolatile memory device 100 may program write data at a sub-block, closer to the common source line CSL, from among the remaining sub-blocks 511 and 512. That is, the nonvolatile memory device 100 may perform a program operation such that a sub-block closest to the common source line CSL is programmed first by priority.

With the above-described memory managing method, it is possible to prevent charge injection from being hindered by a sub-block placed at an upper side (i.e., a sub-block farthest away from the CSL) during programming of a sub-block. Thus, the boosting efficiency of a program operation of the nonvolatile memory device 100 may be improved.

Figure 12:
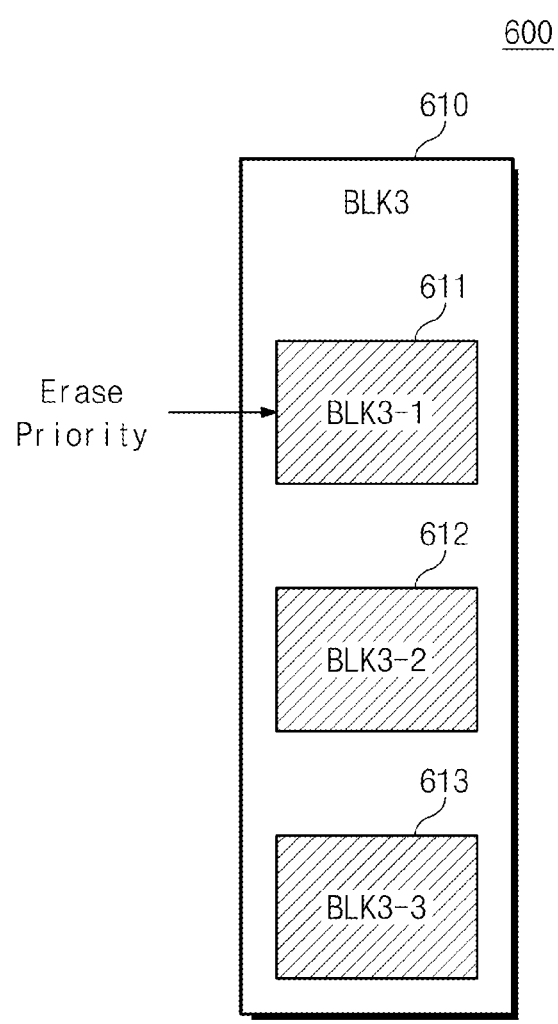
FIG. 12 is a block diagram schematically illustrating a memory managing method according to still another embodiment of the inventive concept.

FIG. 12 is a block diagram schematically illustrating a memory managing method according to still another embodiment of the inventive concept. Referring to FIG. 12, a memory cell array 600 in a nonvolatile memory device 100 may include a memory block 610, which has a plurality of sub-blocks 611, 612, and 613.

In the event that one memory block includes a plurality of sub-blocks, the program boosting efficiency may be reduced. The boosting efficiency may be reduced due to the same cause as described with reference to FIG. 11.

An erase operation may be performed from a sub-block farthest away from a common source line CSL to improve the boosting efficiency, which will be more fully described below.

Referring to FIG. 12, the memory block 610 may include three sub-blocks 611, 612, and 613. However, the inventive concept is not limited thereto. For example, the memory block 610 can be configured to include two or more sub-blocks. The sub-blocks 611, 612, and 613 may be programmed sub-blocks.

The sub-blocks 611, 612, and 613 may share a common source line CSL. A lower sub-block may be closer to the common source line CSL compared with an upper sub-block. That is, an upper sub-block may be farthest away or otherwise spaced apart from the common source line CSL compared with a lower sub-block. The sub-block 613 may be closest to the common source line CSL. A distance between the sub-block 611 and the common source line CSL may be longer than that between the sub-block 612 and the common source line CSL. A distance between the sub-block 612 and the common source line CSL may be longer than that between the sub-block 613 and the common source line CSL.

In response to a data erase request, the nonvolatile memory device 100 may erase data at the sub-block 611 farthest away or otherwise spaced apart from the common source line CSL by priority before erasing data at the sub-blocks 612 or 613, which are located closer to the common source line CSL. In the event that the sub-block 613 located closest to the common source line CSL is to be erased, the nonvolatile memory device 100 may first erase data at a sub-block that is farther away from the common source line CSL, from among the remaining sub-blocks 611 and 612. That is, the nonvolatile memory device 100 may perform an erase operation such that a sub-block farthest from the common source line CSL is programmed first by priority.

With the above-described memory managing method, it is possible to prevent charge injection from being hindered by a sub-block placed at an upper side (i.e., a sub-block farther away from the CSL) at programming of an empty sub-block. Thus, the boosting efficiency of a program operation of the nonvolatile memory device 100 may be improved.

Figure 13:
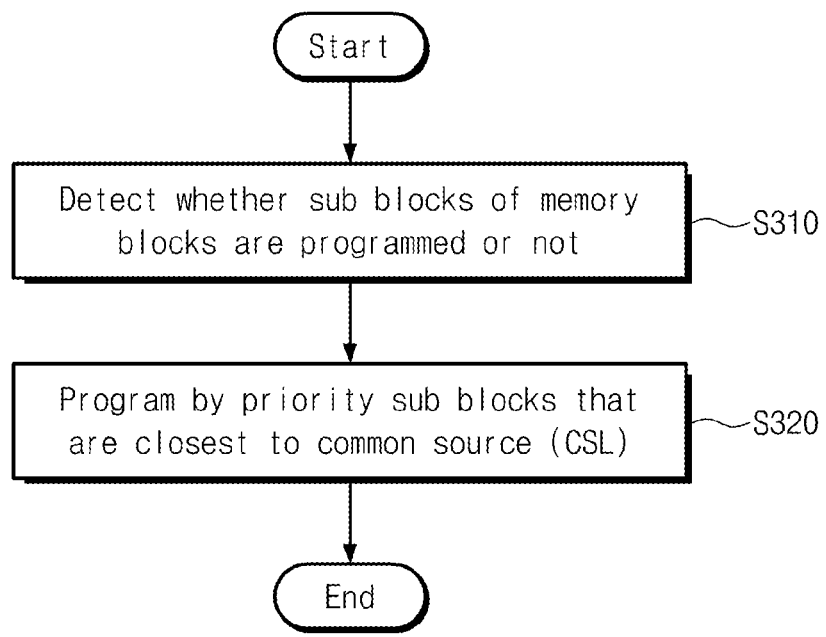
FIG. 13 is a flowchart illustrating a memory managing method according to another embodiment of the inventive concept.

FIG. 13 is a flowchart illustrating a memory managing method according to another embodiment of the inventive concept. In operation S310, a nonvolatile memory device 100 (of FIG. 1) may detect whether sub-blocks in memory blocks are programmed. As described above, whether or not sub-blocks in memory blocks are programmed may indicate that a sub-block is at a program state or an erase state.

In operation S320, the nonvolatile memory device 100 may determine a sub-block to be programmed according to a detection result. More specifically, the nonvolatile memory device 100 may select a sub-block, closest to a common source line CSL, from among unprogrammed sub-blocks in a memory block, to be programmed first, before other sub-blocks that are located farther away from the common source line CSL. The various sub-blocks may be individually programmed by priority based on their proximity to the common source line CSL. In other words, the sub-blocks that are closest to the common source line CSL may be prioritized for programming over sub-blocks that are farther away from the common source line. The programming may be prioritized based on the relative distance of the sub-blocks from the common source line CSL. Thus, the sub-blocks that are relatively closer to the common source line CSL may be programmed prior to the sub-blocks that are relatively farther away from the common source line CSL.

A sub-block may be programmed in the same manner as described in FIG. 11. The nonvolatile memory device 100 may control sub-blocks so as to be programmed independently.

With the above-described memory managing method, it is possible to prevent charge injection from being hindered by a sub-block placed at an upper side (i.e., a sub-block farther away from the CSL) while programming a sub-block. Thus, the boosting efficiency of a program operation of the nonvolatile memory device 100 is improved.

Figure 14:
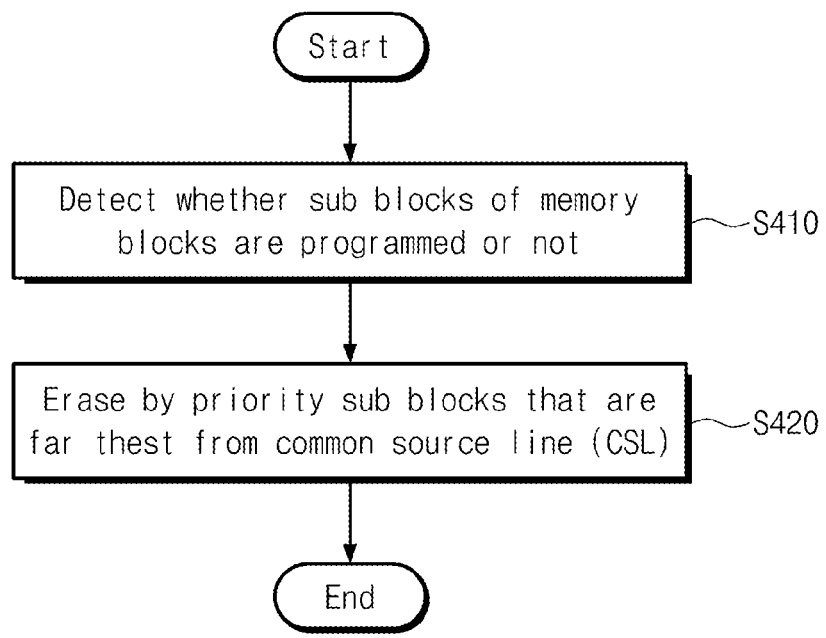
FIG. 14 is a flowchart illustrating a memory managing method according to still another embodiment of the inventive concept.

FIG. 14 is a flowchart illustrating a memory managing method according to still another embodiment of the inventive concept. In operation S410, a nonvolatile memory device 100 may detect whether sub-blocks in memory blocks are programmed. As described above, whether or not sub-blocks in memory blocks are programmed may indicate that a sub-block is at a program state or an erase state.

In operation S420, the nonvolatile memory device 100 may determine a sub-block to be erased according to a detection result. More specifically, the nonvolatile memory device 100 may select a sub-block, farthest from a common source line CSL, from among unprogrammed sub-blocks in a memory block, to be erased first, before other sub-blocks that are located closer to the common source line CSL. The various sub-blocks may be individually erased by priority based on their proximity to the common source line CSL.

A sub-block may be programmed or erased in the same manner as described in FIG. 12. The nonvolatile memory device 100 may control sub-blocks so as to be erased independently.

With the above-described memory managing method, it is possible to prevent charge injection from being hindered by a sub-block placed at an upper side (i.e., a sub-block farther away from the CSL) at programming of an empty sub-block. Thus, the boosting efficiency of a program operation of the nonvolatile memory device 100 may be improved.

Figure 15:
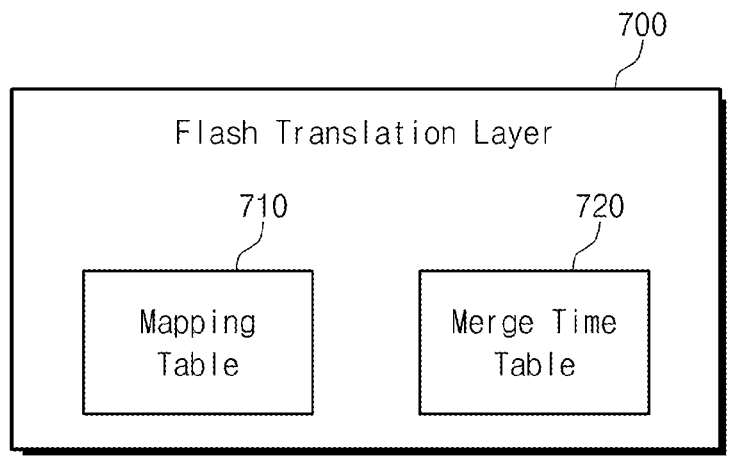
FIG. 15 is a block diagram schematically illustrating a flash translation layer of a nonvolatile memory device according to an embodiment of the inventive concept.

FIG. 15 is a block diagram schematically illustrating a flash translation layer of a nonvolatile memory device according to an embodiment of the inventive concept.

In example embodiments, a flash translation layer 700 may be driven by control logic 150 (of FIG. 1). The flash translation layer 700 may be stored at a predetermined address region of the nonvolatile memory device 100. Upon power-on, the flash translation layer 700 may be read out from the predetermined address region.

Referring to FIGS. 1 and 15, the flash translation layer 700 may translate a logical address LBA received from a host (not shown) into a physical address PBA of the nonvolatile memory device 100.

The flash translation layer 700 may perform background operations for improving an operating characteristic of the nonvolatile memory device 100. For example, the flash translation layer 700 may perform background operations such as merge, garbage collection, wear-leveling, refresh, and the like.

The flash translation layer 700 may include a mapping table 710 and a merge time table 720. The mapping table 710 may be configured to store mapping information between logical addresses LBA and physical addresses PBA. For example, in a case where data corresponding to a logical address A is stored at a storage region of a physical address C of the nonvolatile memory device 100, the mapping table 710 may be configured to store mapping information between the logical address A and the physical address C. If a physical address at which data is stored is changed due to background operations such as merge, garbage collection, wear-leveling, refresh, and the like, mapping information stored at the mapping table 710 may be updated.

The merge time table 720 may be configured to store a merge time associated with each of sub-blocks of memory blocks BLK1 to BLKh in the nonvolatile memory device 100.

The nonvolatile memory device 100 may manage memory blocks based on merge times stored at the merge time table 720. This will be more fully described with reference to FIG. 18.

Figure 16:
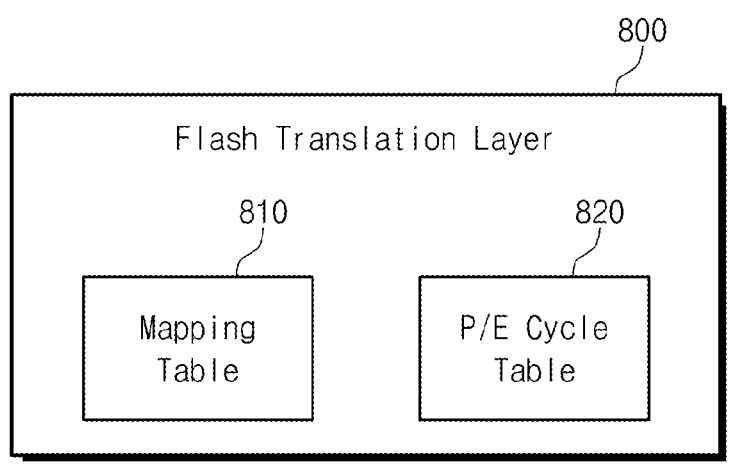
FIG. 16 is a block diagram schematically illustrating a flash translation layer of a nonvolatile memory device according to another embodiment of the inventive concept.

FIG. 16 is a block diagram schematically illustrating a flash translation layer of a nonvolatile memory device according to another embodiment of the inventive concept.

A flash translation layer 800 in FIG. 16 may be identical to that in FIG. 15 except that a merge time table 720 is replaced with a P/E cycle table 820 and the mapping table is indicated by 810.

The P/E cycle table 820 may be configured to store a P/E cycle number associated with each of sub-blocks of memory blocks BLK1 to BLKh in the nonvolatile memory device 100. Herein, a P/E cycle may be formed of a program operation and an erase operation.

The nonvolatile memory device 100 may manage memory blocks based on P/E cycles stored at the P/E cycle table 820. This will be more fully described with reference to FIG. 19.

Figure 17:
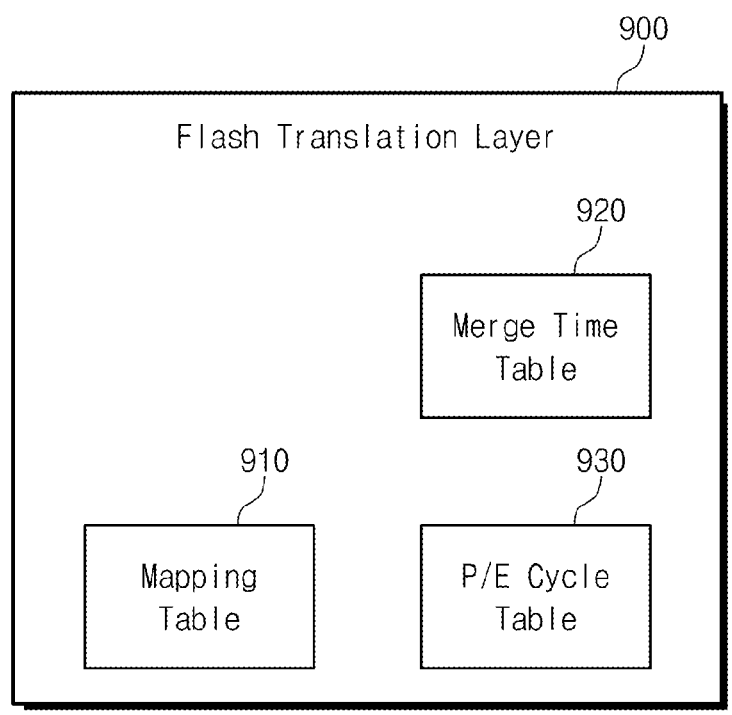
FIG. 17 is a block diagram schematically illustrating a flash translation layer of a nonvolatile memory device according to still another embodiment of the inventive concept.

FIG. 17 is a block diagram schematically illustrating a flash translation layer of a nonvolatile memory device according to still another embodiment of the inventive concept.

A flash translation layer 900 in FIG. 17 may be configured to include a merge time table 920 identical to that described in FIG. 15, a P/E cycle table 930 identical to that described in FIG. 16, and a mapping table 910 identical to that described in FIG. 15.

The nonvolatile memory device 100 may manage memory blocks based on merge times stored at the merge time table 920 and P/E cycles stored at the P/E cycle table 930. This will be more fully described with reference to FIGS. 18 and 19.

Figure 18:
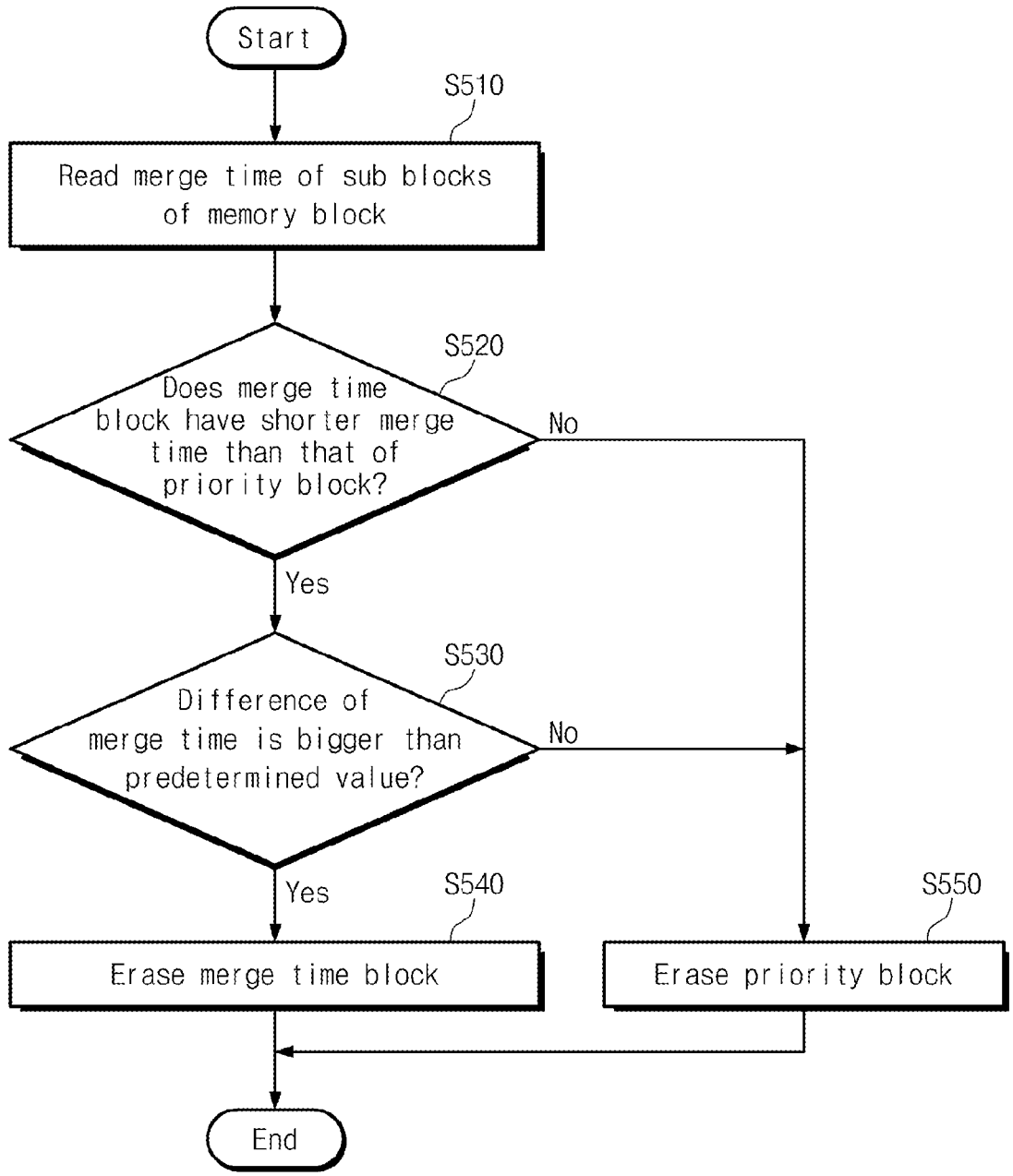
FIG. 18 is a flowchart illustrating a memory managing method according to still another embodiment of the inventive concept.

FIG. 18 is a flowchart illustrating a memory managing method according to still another embodiment of the inventive concept. In operation S510, a nonvolatile memory device 100 may read merge times of sub-blocks in memory blocks from a merge time table 720 and/or 920.

In operation S520, the nonvolatile memory device 100 may compare merge times of the sub-blocks to selectively erase the sub-blocks. The nonvolatile memory device 100 may detect a sub-block (hereinafter, referred to as a merge time block) having a merge time shorter than that of a sub-block (hereinafter, a priority block) having an erase priority.

The priority block may be a sub-block that is to be selected as an erase target when a merge time is not considered. The priority block may be determined according to a distance spaced apart from a common source line CSL and whether sub-blocks in a memory block are programmed. More specifically, when a partial storage block and an empty memory block exist, a sub-block included in the partial storage block may be selected as the priority block to minimize the number of partial storage blocks. Alternatively, in a plurality of sub-blocks included in a memory block, a sub-block, farthest from the common source line CSL, from among programmed sub-blocks may be selected as the priority block to improve a program boosting efficiency.

To select a sub-block (or, a priority block) to be first erased according to the distance spaced apart from a common source line CSL and whether sub-blocks in a memory block are programmed, may be performed in the same manner as described with reference to FIGS. 9, 11, and 12.

If a merge time block exists, the method proceeds to operation S530. If no merge time block exists, the method proceeds to operation S550.

In operation S530, the nonvolatile memory device 100 may compare a merge time difference between the priority block and the merge time block with a predetermined value. In example embodiments, the predetermined value may be arbitrarily determined by a maker of the nonvolatile memory device 100 or a user.

If the merge time difference is larger than the predetermined value, the method proceeds to operation S540. If the merge time difference is smaller than the predetermined value, the method proceeds to operation S550.

In operation S540, the merge time difference may be larger than the predetermined value. Thus, to make efficient management of a memory, the nonvolatile memory device 100 (of FIG. 1) may determine a sub-block to be erased considering the merge time difference by priority. In other words, the nonvolatile memory device 100 may erase a merge time block having a short merge time regardless of an erase priority of a priority block.

In example embodiments, in case that a plurality of merge time blocks exists, the nonvolatile memory device 100 may erase a merge time block having a shortest merge time.

In operation S550, the merge time difference may be smaller than the predetermined value. Thus, the nonvolatile memory device 100 may erase a priority block to reduce the read disturbance and to improve the booting efficiency.

With the above description, in case that the merge time difference is large, the nonvolatile memory device 100 may erase a sub-block having a short merge time by priority to provide efficient management of a memory. If the merge time difference is small, the nonvolatile memory device 100 may erase a priority block to reduce the read disturbance and to improve the booting efficiency. Thus, the performance of the nonvolatile memory device 100 is improved.

Figure 19:
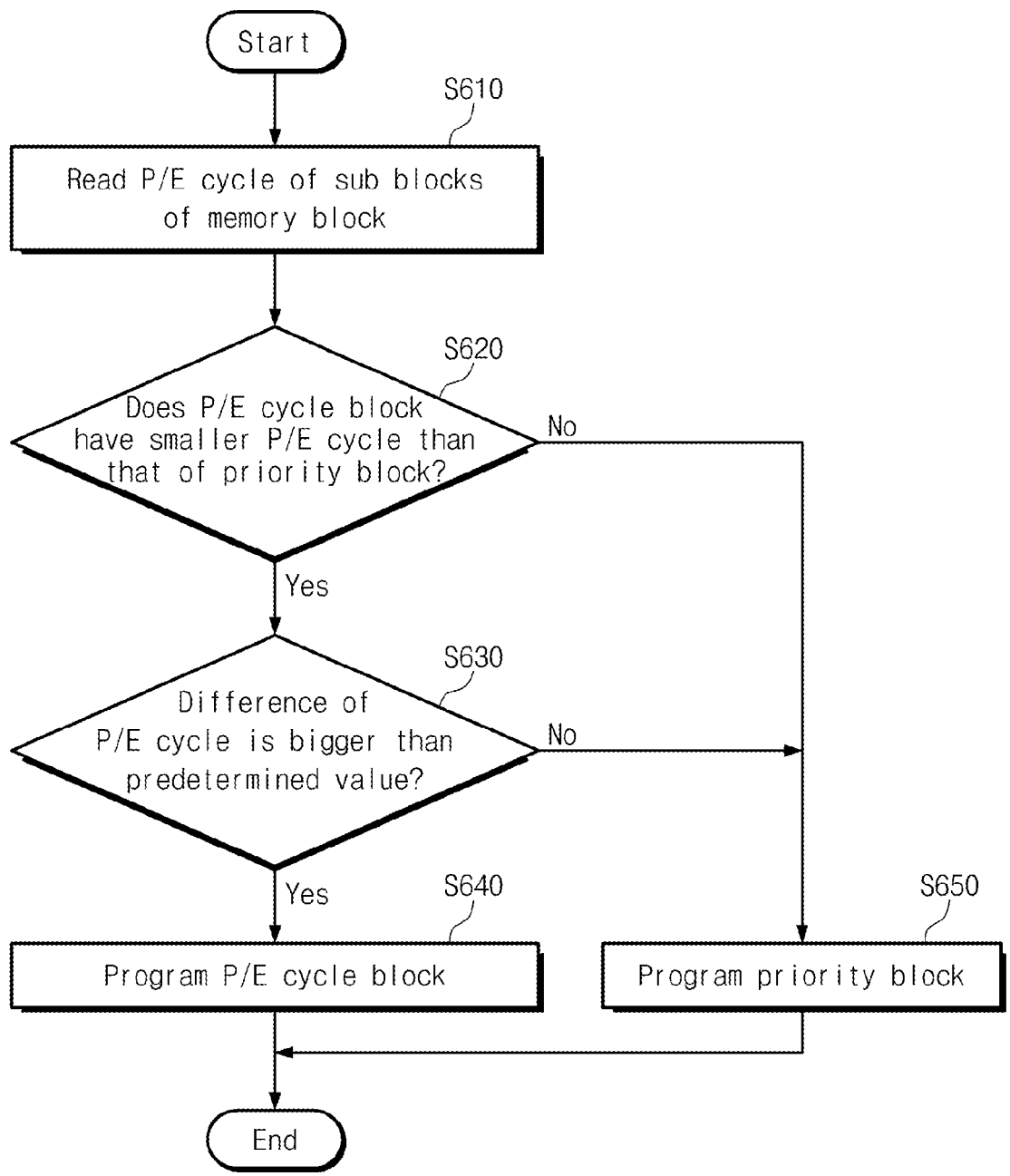
FIG. 19 is a flowchart illustrating a memory managing method according to still another embodiment of the inventive concept.

FIG. 19 is a flowchart illustrating a memory managing method according to still another embodiment of the inventive concept. In operation S610, a nonvolatile memory device 100 may read P/E cycle numbers of sub-blocks in memory blocks from a P/E cycle table 820 and/or 930.

In operation S620, the nonvolatile memory device 100 (of FIG. 1) may compare P/E cycles of the sub-blocks to selectively program the sub-blocks. The nonvolatile memory device 100 may detect a sub-block (hereinafter, referred to as a P/E cycle block) having a P/E cycle smaller than that of a sub-block (hereinafter, a priority block) having a program priority.

The priority block may be a sub-block to be first selected as a program target when a P/E cycle is not considered. The priority block may be determined according to a distance spaced apart from a common source line CSL and whether sub-blocks in a memory block are programmed. More specifically, when a partial storage block and an empty memory block exist, a sub-block included in the partial storage block may be selected as the priority block to minimize the number of partial storage blocks. Alternatively, in a plurality of sub-blocks included in a memory block, a sub-block, closest to the common source line CSL, from among programmed sub-blocks may be selected as the priority block to improve a program boosting efficiency.

To select a sub-block (or, a priority block) to be first programmed according to the distance spaced apart from a common source line CSL and whether sub-blocks in a memory block are programmed may be performed in the same manner as described with reference to FIGS. 9, 11, and 12.

If a P/E cycle block exists, the method proceeds to operation S630. If no P/E cycle block exists, the method proceeds to operation S650.

In operation S630, the nonvolatile memory device 100 may compare a P/E cycle difference between the priority block and the P/E cycle block with a predetermined value. In example embodiments, the predetermined value may be arbitrarily determined by a maker of the nonvolatile memory device 100 or a user.

If the P/E cycle difference is larger than the predetermined value, the method proceeds to operation S640. If the P/E cycle difference is smaller than the predetermined value, the method proceeds to operation S650.

In operation S640, the P/E cycle difference may be larger than the predetermined value. Thus, to make efficient management of a memory, the nonvolatile memory device 100 may determine a sub-block to be programmed considering the P/E cycle difference by priority. In other words, the nonvolatile memory device 100 may program a P/E cycle block having a small P/E cycle regardless of a program priority of a priority block.

In example embodiments, in case that a plurality of P/E cycle blocks exists, the nonvolatile memory device 100 may erase a P/E cycle block having a smallest P/E cycle.

In operation S650, the P/E cycle difference may be smaller than the predetermined value. Thus, the nonvolatile memory device 100 may program a priority block to reduce the read disturbance and to improve the booting efficiency.

With the above description, in case that the P/E cycle difference is large, the nonvolatile memory device 100 may erase a sub-block having a small P/E cycle by priority to provide efficient management of a memory. If the P/E cycle difference is small, the nonvolatile memory device 100 may erase a priority block to reduce the read disturbance and to improve the booting efficiency. Thus, the performance of the nonvolatile memory device 100 is improved.

Figure 20:
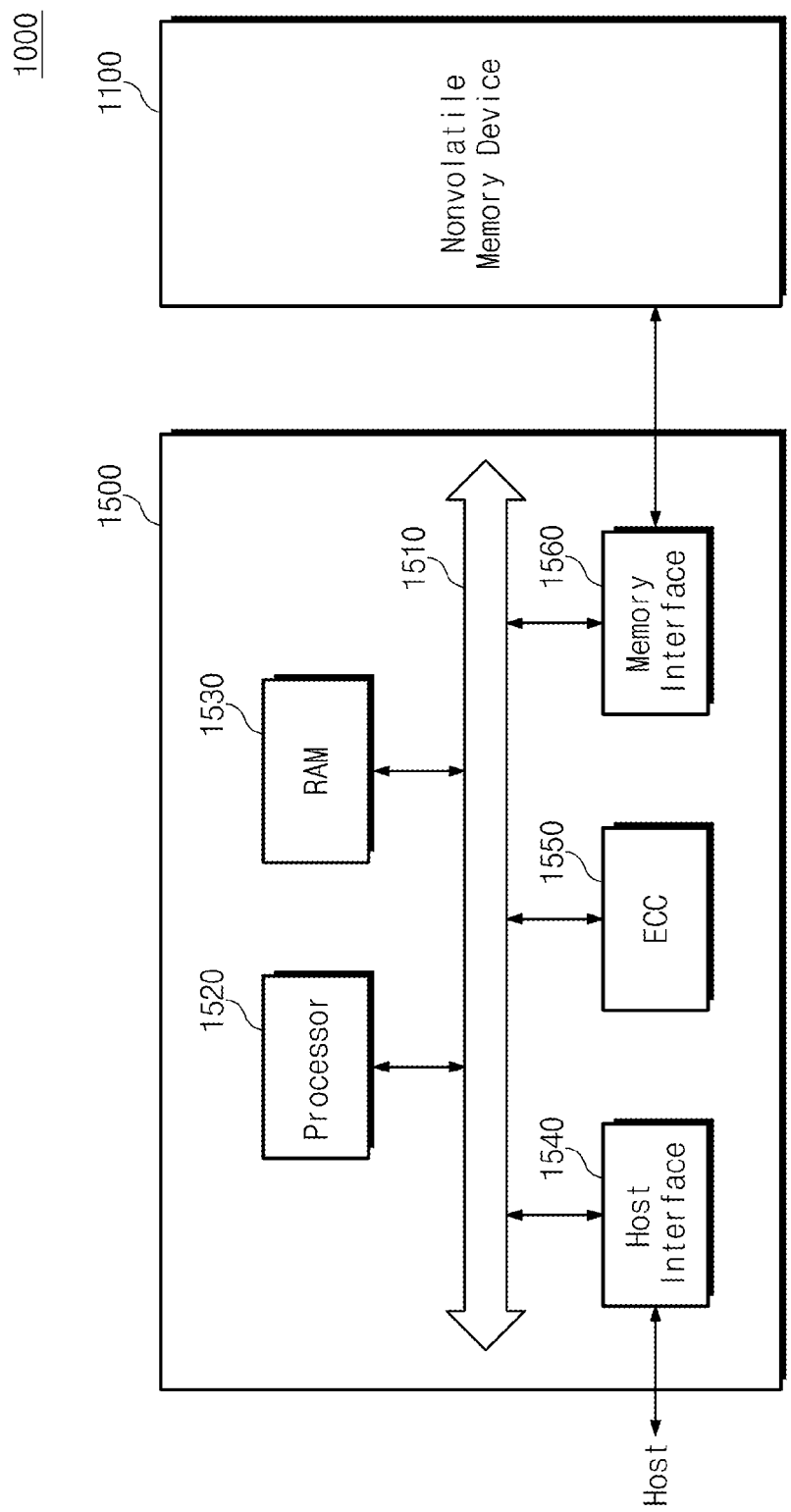
FIG. 20 is a block diagram schematically illustrating a memory system according to an embodiment of the inventive concept.

FIG. 20 is a block diagram schematically illustrating a memory system according to an embodiment of the inventive concept. Referring to FIG. 20, a memory system 1000 may include a nonvolatile memory device 1100 and a controller 1500.

The nonvolatile memory device 1100 may be configured the same as described with reference to FIGS. 1 to 19. That is, a memory block BLKi may include a plurality of sub-blocks. Dummy memory cells DMC and dummy word lines DWL may be provided between sub-blocks. Sub-blocks may be programmed or erased independently. When write data is programmed, a memory block including a programmed sub-block may be first programmed. Alternatively, when write data is programmed at a memory block including unprogrammed sub-blocks, a sub-block closest to a common source line CSL may be first programmed. In other example embodiments, when a sub-block of a memory block including programmed sub-blocks is erased, a sub-block farthest from the common source line CSL may be first erased. Thus, it is possible to improve the reliability and program efficiency of the memory system 1000.

The controller 1500 may be connected to a host and the nonvolatile memory device 1100. The controller 1500 may be configured to access the nonvolatile memory device 1100 in response to a request from the host. For example, the controller 1500 may be configured to control reading, programming, and erasing of the nonvolatile memory device 1100. The controller 1500 may be configured to provide an interface between the host and the nonvolatile memory device 1100. The controller 1500 may be configured to drive firmware for controlling the nonvolatile memory device 1100.

The controller 1500 may include a processor 1520, a RAM 1530, a host interface 1540, an ECC block 1550, and a memory interface 1560, which are connected to an internal bus as a channel.

The processor 1520 may be configured to control an overall operation of the controller 1500. For example, the processor 1520 may be configured to drive firmware, codes, and the like driven at the controller 1500. For example, the processor 1520 may be configured to drive firmware, codes, and the like that are configured to control the nonvolatile memory device 1100.

The RAM 1530 may be used as at least one of a work memory, a cache memory between the nonvolatile memory device 1100 and the host, and a buffer memory between the nonvolatile memory device 1100 and the host.

The host interface 1540 may include the protocol for executing data exchange between the host and the controller 1500. For example, the host interface 1540 may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, an IDE (Integrated Drive Electronics) protocol, and a Firewire.

The ECC block 1550 may be configured to detect and correct an error of data read from the nonvolatile memory device 1100 using an error correcting code (ECC). The ECC block 1550 may include the error correcting code (ECC).

The memory interface 1560 may interface with the nonvolatile memory device 1100. For example, the memory interface 1560 may include a NAND interface or a NOR interface.

The controller 1500 and the nonvolatile memory device 1100 may be integrated to one semiconductor device. The controller 1500 and the nonvolatile memory device 1100 may be integrated to one semiconductor device to form a memory card. For example, the controller 1500 and the nonvolatile memory device 1100 may be integrated to one semiconductor device to form a memory card such as a PC (or, PCMCIA) card, a Compact Flash (CF) card, a SmartMedia (SM) card, a memory stick, a multimedia card (MMC, RS-MMC, MMC-micro), an SD card (SD, miniSD, SDHC), a Universal Flash Storage (UFS) device, or the like.

The controller 1500 and the nonvolatile memory device 1100 may be integrated to one semiconductor device to form a Solid State Drive (SSD). The SSD may include a storage device which is configured to store data using semiconductor memories. In case that the memory system 1000 is used as the SSD, an operating speed of the host connected with the memory system 1000 may be remarkably improved.

In example embodiments, the memory system 1000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In example embodiments, the nonvolatile memory device 1100 or the memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 21:
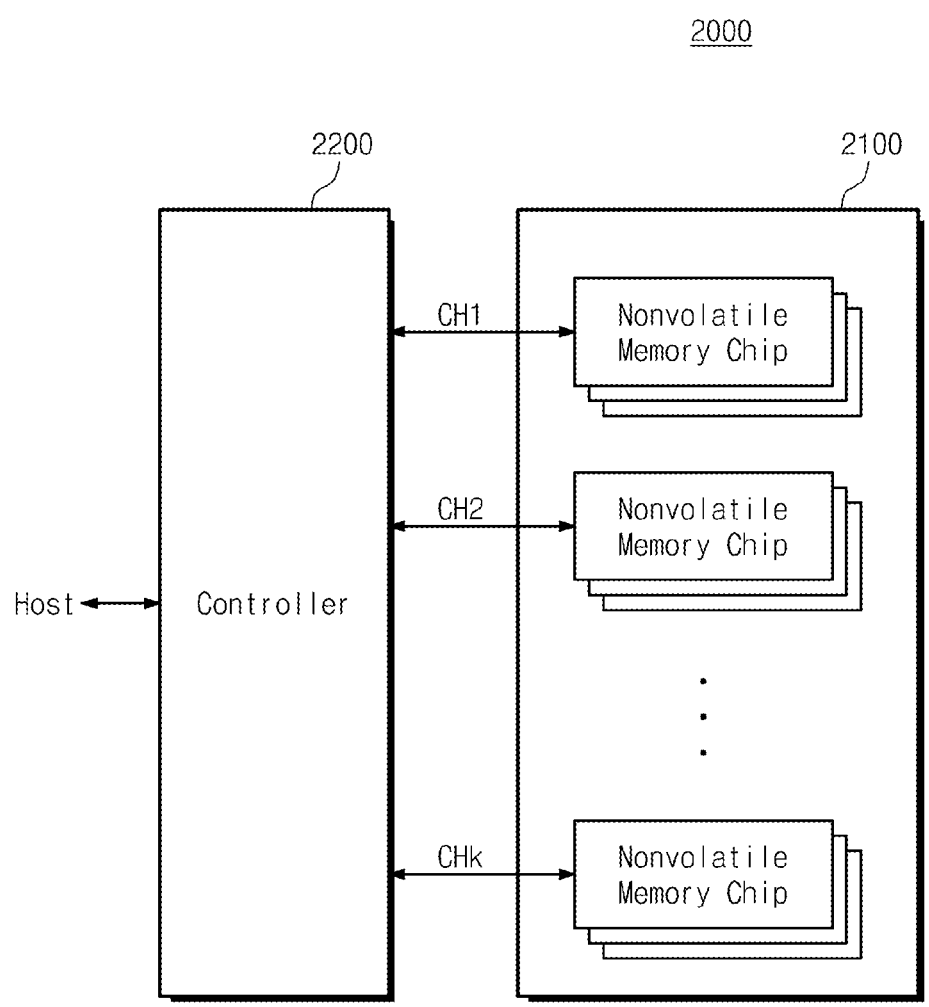
FIG. 21 is a block diagram illustrating an application of a memory system in FIG. 20.

FIG. 21 is a block diagram illustrating an application of a memory system in FIG. 20. Referring to FIG. 21, a memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In example embodiments, the plurality of nonvolatile memory chips may communicate with the controller 2200 via a plurality of channels CH1 to CHk.

Each nonvolatile memory chip may be configured the same as described with reference to FIGS. 1 to 19. That is, a memory block BLKi may include a plurality of sub-blocks. Dummy memory cells DMC and dummy word lines DWL may be provided between sub-blocks. Sub-blocks may be programmed or erased independently. When write data is programmed, a memory block including a programmed sub-block may be first programmed. Alternatively, when write data is programmed at a memory block including unprogrammed sub-blocks, a sub-block closest to a common source line CSL may be first programmed. In other example embodiments, when a sub-block of a memory block including programmed sub-blocks is erased, a sub-block farthest from the common source line CSL may be first erased. Thus, it is possible to improve the reliability and program efficiency of the memory system 2000.

In FIG. 21, there is described the case that one channel is connected with a plurality of nonvolatile memory chips. However, the memory system 2000 can be modified such that one channel is connected with one nonvolatile memory chip.

Figure 22:
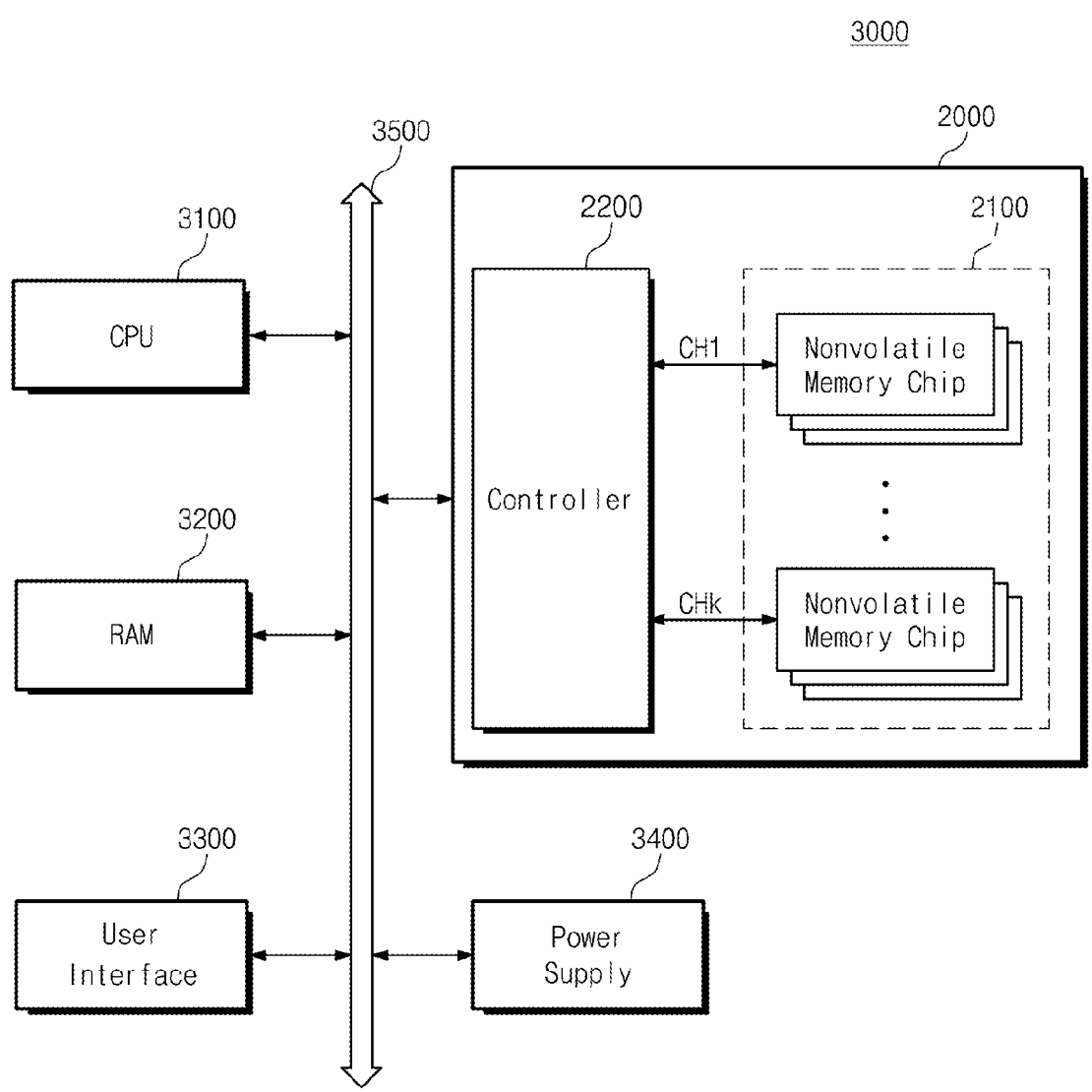
FIG. 22 is a block diagram schematically illustrating a computing system including a memory system in FIG. 21.

FIG. 22 is a block diagram schematically illustrating a computing system including a memory system in FIG. 21. Referring to FIG. 22, a computing system 3000 may include a CPU 3100, a RAM 3200, a user interface 3300, a power supply 3400, and a memory system 2000.

The memory system 2000 may be connected to the elements 3100 to 3400 via a system bus 3500. Data provided via the user interface 3300 or processed by the CPU 3100 may be stored at the memory system 2000.

In FIG. 22, there is illustrated the case that a nonvolatile memory device 2100 is connected to the system bus 3500 via a controller 2200. However, the nonvolatile memory device 2100 can be electrically connected directly to the system bus 3500. In this case, read and erase operations of the nonvolatile memory device 2100 may be controlled by the CPU 3100. Also, a program operation of the nonvolatile memory device 2100 may be controlled by the CPU 3100.

In FIG. 22, there is illustrated an example that the computing system 3000 includes a memory system 2000 described with reference to FIG. 21. However, the memory system 2000 can be replaced with a memory system 1000 described with reference to FIG. 20.

In example embodiments, the memory system 2000 can be configured to include memory systems 1000 and 2000 described with reference to FIGS. 20 and 21.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory managing method of a nonvolatile memory device which comprises memory blocks having a three dimensional cell string structure, the memory blocks respectively comprise sub-blocks stacked in a direction perpendicular to a substrate, the method comprising:

detecting whether the sub-blocks of a memory block among the memory blocks are programmed; and programming write data at the memory block according to the detection result, wherein programming includes programming the write data at a sub-block, closest to a common source line, from among unprogrammed sub-blocks of the memory block, the method further comprising:

reading merge times of the sub-blocks in the memory block;

determining a priority block to be a sub-block having an erase priority; and selectively erasing the priority block from among the sub-blocks according to the read merge times.

2. The memory managing method of claim 1, further comprising:
erasing at least one sub-block in the memory block according to the detection result.

3. The memory managing method of claim 2, wherein:
the at least one sub-block is farthest from the common source line, from among programmed sub-blocks in the memory block; and
erasing includes erasing the at least one sub-block that is farthest from the common source line, prior to erasing other sub-blocks from among the programmed sub-blocks in the memory block.

4. The memory managing method of claim 3, wherein the sub-blocks share the common source line.

5. The memory managing method of claim 1, wherein determining includes determining the priority block according to relative distances between the common source line and the sub-blocks.

6. The memory managing method of claim 1, wherein selectively erasing further comprises:
determining a merge time block to be a sub-block having a merge time shorter than that of the priority block of the memory block; and
comparing a merge time difference between the priority block and the merge time block with a predetermined value.

7. The memory managing method of claim 1, further comprising reading out the merge times from a merge time table included in a flash translation layer.

8. A method for programming or erasing memory blocks which have a three dimensional cell string structure, the memory blocks respectively comprise sub-blocks stacked in a direction perpendicular to a substrate, the method comprising:
detecting which of the sub-blocks of the memory blocks are programmed;
detecting which of the sub-blocks of the memory blocks are unprogrammed;
determining that at least one of the memory blocks is a partial storage block having at least one programmed sub-block and at least one unprogrammed sub-block;
determining that at least one of the memory blocks is an empty storage block having no programmed sub-block; and
allocating and programming write data at the partial storage block prior to the empty storage block.

9. The method of claim 8, further comprising:
detecting relative distances of sub-blocks of the plurality of memory blocks to a common source line; and
prioritizing the programming of the sub-blocks that are relatively closer to the common source line over the sub-blocks that are relatively farther away from the common source line.

10. The method of claim 9, further comprising:
programming the sub-blocks that are relatively closer to the common source line prior to programming the sub-blocks that are relatively farther away from the common source line based on the prioritization.

11. The method of claim 9, further comprising:
determining a priority block according to the relative distances of the sub-blocks of the plurality of memory blocks to the common source line and according to whether or not the sub-blocks in each of the memory blocks are programmed.

12. The method of claim 11, further comprising:
programming the priority block.

13. The method of claim 8, further comprising:
reading merge times of the sub-blocks in the memory blocks;
determining a priority block to be a sub-block having an erase priority; and
selectively erasing the priority block from among the sub-blocks according to the read merge times.

* * * * *